United States Patent
Takeoka

(10) Patent No.: US 9,018,709 B2
(45) Date of Patent: Apr. 28, 2015

(54) SEMICONDUCTOR DEVICE

(71) Applicant: Panasonic Corporation, Kadoma-shi, Osaka (JP)

(72) Inventor: Shinji Takeoka, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 225 days.

(21) Appl. No.: 13/666,695

(22) Filed: Nov. 1, 2012

(65) Prior Publication Data
US 2013/0056833 A1    Mar. 7, 2013

Related U.S. Application Data

(63) Continuation of application No. PCT/JP2011/002064, filed on Apr. 7, 2011.

(30) Foreign Application Priority Data

Sep. 15, 2010   (JP) ................. 2010-206601

(51) Int. Cl.
| | | |
|---|---|---|
| H01L 21/70 | (2006.01) | |
| H01L 21/8238 | (2006.01) | |
| H01L 29/49 | (2006.01) | |
| H01L 29/51 | (2006.01) | |

(52) U.S. Cl.
CPC ..... *H01L 21/823842* (2013.01); *H01L 21/823857* (2013.01); *H01L 29/4966* (2013.01); *H01L 29/513* (2013.01); *H01L 29/517* (2013.01)

(58) Field of Classification Search
USPC ......... 257/369, 411, 368, 390, 391, 401, 410, 257/E29.255, E27.062
See application file for complete search history.

(56) References Cited

U.S. PATENT DOCUMENTS

| | | | | |
|---|---|---|---|---|
| 7,005,344 | B2 * | 2/2006 | Forbes et al. ............... | 438/257 |
| 7,517,750 | B2 * | 4/2009 | Choi et al. .................. | 438/211 |
| 7,550,801 | B2 * | 6/2009 | Kikuchi et al. ............ | 257/316 |
| 8,158,500 | B2 * | 4/2012 | Anderson et al. .......... | 438/585 |

(Continued)

FOREIGN PATENT DOCUMENTS

| | | |
|---|---|---|
| JP | 04-340766 A | 11/1992 |
| JP | 2003-023152 A | 1/2003 |

(Continued)

OTHER PUBLICATIONS

Chen, X. et al. "A Cost Effective 32nm High-K/ Metal Gate CMOS Technology for Low Power Applications with Single-Metal/Gate-First Process". Symposium on VLSI Technology Digest of Technical Papers. pp. 88-89. 2008.

(Continued)

*Primary Examiner* — Fernando L Toledo
*Assistant Examiner* — Victoria K Hall
(74) *Attorney, Agent, or Firm* — McDermott Will & Emery LLP

(57) ABSTRACT

A semiconductor device includes: a first field-effect transistor of a first conductivity type formed on a first active region of a semiconductor substrate. The first field-effect transistor includes a first gate insulating film formed on the first active region, and a first gate electrode formed on the first gate insulating film. The first gate electrode includes a first metal electrode formed on the first gate insulating film, a first interface layer formed on the first metal electrode, and a first silicon electrode formed on the first interface layer.

19 Claims, 10 Drawing Sheets

(56) References Cited

U.S. PATENT DOCUMENTS

| | | | |
|---|---|---|---|
| 8,178,939 B2* | 5/2012 | Loh et al. | 257/471 |
| 8,273,618 B2* | 9/2012 | Andreoni et al. | 438/216 |
| 8,410,541 B2* | 4/2013 | Wang et al. | 257/324 |
| 8,410,555 B2* | 4/2013 | Wang et al. | 257/350 |
| 8,658,501 B2* | 2/2014 | Guha et al. | 438/275 |
| 8,674,457 B2* | 3/2014 | Toh et al. | 257/410 |
| 2004/0014306 A1 | 1/2004 | Komatsu | |
| 2007/0034966 A1 | 2/2007 | Kim et al. | |
| 2007/0158734 A1 | 7/2007 | Chindalore | |
| 2008/0277736 A1 | 11/2008 | Nakajima | |
| 2010/0163959 A1* | 7/2010 | Keller | 257/321 |
| 2010/0176456 A1 | 7/2010 | Ikeno et al. | |
| 2010/0291765 A1 | 11/2010 | Nakajima | |
| 2012/0049297 A1* | 3/2012 | Takeoka | 257/410 |

FOREIGN PATENT DOCUMENTS

| | | |
|---|---|---|
| JP | 2007-13182 A | 1/2007 |
| JP | 2008-282856 A | 11/2008 |
| JP | 2009-054609 A | 3/2009 |
| JP | 2009-522824 A | 6/2009 |
| JP | 2010-161308 A | 7/2010 |
| JP | 2010-267678 A | 11/2010 |
| WO | WO-2007/120301 A2 | 10/2007 |

OTHER PUBLICATIONS

Kita, K. et al. "Intrinsic Origin of Electric Dipoles Formed at High-k/SiO2 Interface". Electron Devices Meeting. pp. 29-32. Dec. 2008.
International Search Report issued in International Patent Application No. PCT/JP2011/002064 dated May 10, 2011.

* cited by examiner

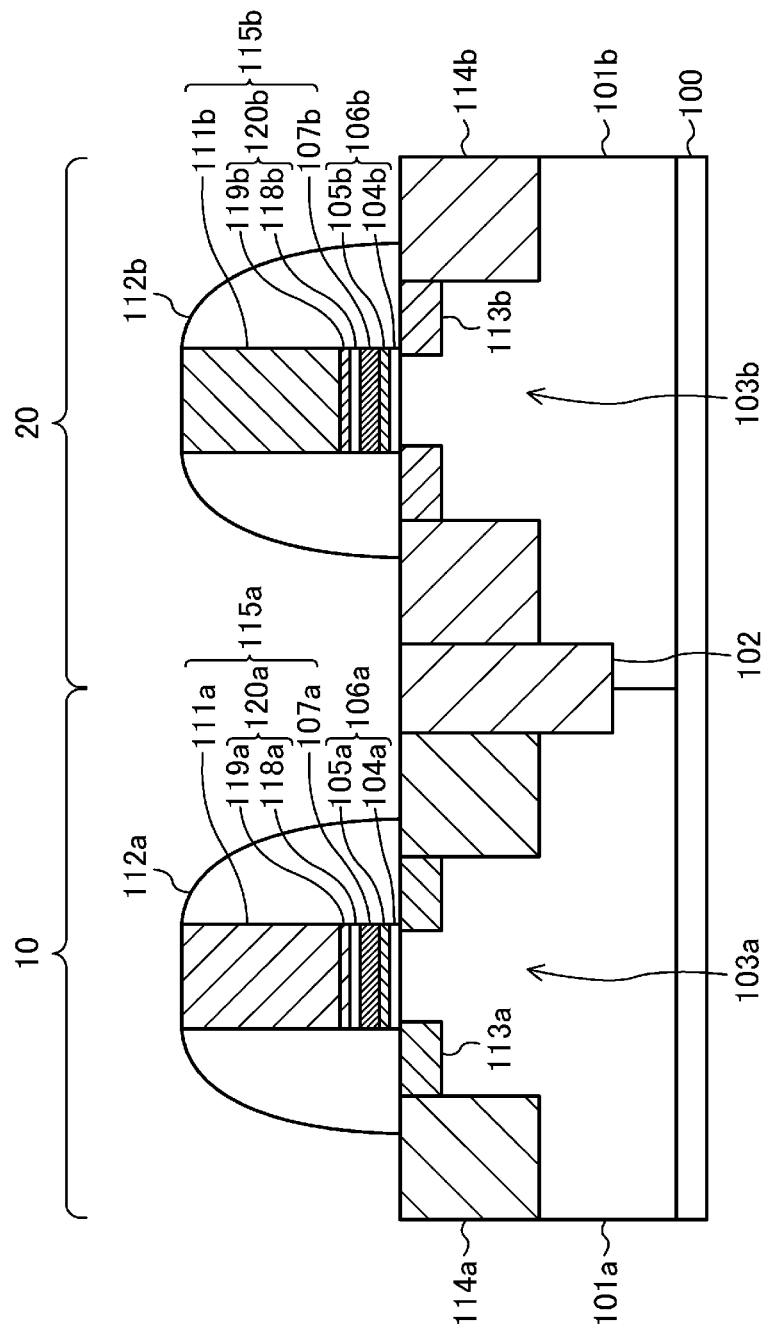

SEMICONDUCTOR DEVICE

CROSS-REFERENCE TO RELATED APPLICATIONS

This is a continuation of PCT International Application PCT/JP2011/002064 filed on Apr. 7, 2011, which claims priority to Japanese Patent Application No. 2010-206601 filed on Sep. 15, 2010. The disclosures of these applications including the specifications, the drawings, and the claims are hereby incorporated by reference in their entirety.

BACKGROUND

The present disclosure relates to semiconductor devices including a field-effect transistor including a gate electrode having a metal electrode and a silicon electrode formed on the metal electrode, and methods for fabricating the same.

As the design rule of semiconductor devices is further reduced, the degree of integration of semiconductor integrated circuits has dramatically increased, and one hundred million or more field-effect transistors (FETs) can be formed on a single chip. In order to achieve a high performance transistor, not only the gate length of the transistor, but also the thickness of a gate insulating film need to be reduced. Conventionally, a silicon dioxide film or a silicon oxynitride film which is a film obtained by nitriding a silicon dioxide film has been used as a gate insulating film; however, a thin film region having an equivalent oxide thickness (EOT) equal to or less than 2 nm increases the gate leakage current, resulting in an increase in power consumption of an integrated circuit.

To address the problem, in order to reduce the EOT while reducing the gate leakage current, attention has been given to a gate insulating film made of a high dielectric constant material. Moreover, in order to further reduce the EOT, a metal inserted polysilicon stacked FET (MIPS FET) in which a metal electrode made of, e.g., titanium nitride or tantalum nitride is interposed between a silicon electrode conventionally used as a gate electrode and a gate insulating film has been often researched and developed (see, for example, Japanese Patent Publication No. 2003-023152). The MIPS FET includes the metal electrode formed under the silicon electrode (toward the gate insulating film), and thus, depletion of the silicon electrode can be reduced, thereby providing higher performance of the transistor.

The MIPS FET is achieved by forming the metal electrode having a relatively small thickness of about 5 nm under the silicon electrode conventionally used as a gate electrode and having a relatively large thickness of 50-100 nm. It is easy to allow the shape of a gate electrode, i.e., for example, the size and height of the gate electrode, to be substantially equivalent to that of the conventionally used silicon electrode, and thus, a MIPS FET has been researched and developed as one of promising gate electrode structures for FETs with design rules of 32 nm or less (see, for example, X. Chen et al., "A Cost Effective 32 nm High-k/Metal Gate CMOS Technology for Low Power Applications with Single-Metal/Gate-First Process," Symposium on VLSI Tech., p. 88, 2008).

SUMMARY

However, when an attempt is made to achieve a FET (MIPS FET) having a MIPS structure, the alternating current (AC) characteristics of a semiconductor integrated circuit are degraded due to an interface resistance occurring at the interface between a metal electrode and a silicon electrode.

FIG. 10 illustrates a schematic cross-sectional structure of a p-type FET having a conventional MIPS structure. An active region 302 is formed in an upper portion of a semiconductor substrate 300 containing n-type impurities and made of silicon, such as an n-well, so as to be surrounded by an isolation region 301. A gate insulating film 305 made of a multilayer film of, e.g., a silicon dioxide film 303 and a hafnium oxide film 304 is formed on the active region 302. A gate electrode 308 including, for example, a metal electrode 306 made of tantalum nitride and a silicon electrode 307 made of p-type polysilicon is formed on the gate insulating film 305.

Sidewall spacers 309 are formed on both lateral side surfaces of a structure of the gate insulating film 305 and the gate electrode 308.

P-type extension regions 310 are formed in regions of an upper portion of the active region 302 located laterally outward of the gate electrode 308, and furthermore, p-type source/drain regions 311 connected to the corresponding p-type extension regions 310 are formed in regions of the upper portion of the active region 302 located laterally outward of the gate electrode 308 and laterally outward of the p-type extension regions 310.

The interface resistance occurring at the interface between the metal electrode 306 and the silicon electrode 307 depends on the height of a Schottky barrier corresponding to the difference in work function between materials of the electrodes. While the work function of tantalum nitride is about 4.5 eV, the work function of p-type polysilicon is about 5.1 eV. Therefore, a Schottky barrier formed at the interface between the metal electrode 306 and the silicon electrode 307 has a relatively large height of about 0.6 eV.

FIG. 11 illustrates energy bands formed by providing contact between the metal electrode 306 made of tantalum nitride and the p-type silicon electrode 307. The work function of p-type polysilicon is higher than that of tantalum nitride, and thus, when the electrodes are brought into contact with each other, the energy bands of p-type polysilicon are bent downward, thereby forming a depletion layer (a region where the bands are bent) at the interface between the electrodes. As a result, an interface resistance occurs at the interface between the metal electrode 306 and the silicon electrode 307.

The p-type silicon electrode 307 is generally formed by implanting p-type impurity ions, such as boron ions, into an undoped silicon electrode. Specifically, in order to reduce the penetration of implantation ions, i.e., boron ions, into the semiconductor substrate 300, a process is used in which ions are implanted into an upper portion of the undoped silicon electrode to, e.g., a depth of 20-30 nm from the top surface of the undoped silicon electrode, and the entire silicon electrode 307 is changed into a p-type semiconductor by subsequent heat treatment.

Thus, the concentration of p-type impurities at the interface between the silicon electrode 307 and the metal electrode 306, i.e., in a lower portion of the silicon electrode 307, is lower than that of p-type impurities in an upper portion thereof. Here, when the concentration of p-type impurities at the interface between the silicon electrode 307 and the metal electrode 306 is $7 \times 10^{19}$ atoms/cm$^3$, and the height of the Schottky barrier is 0.6 eV, the interface resistance at the interface therebetween is about $2 \times 10^{-6}$ $\Omega$cm$^2$. This value is extremely greater than the value generally required by a 32-nm generation device, i.e., a value equal to or less than $1 \times 10^{-7}$ $\Omega$cm$^2$.

The interface resistance can be reduced by increasing the concentration of p-type impurities in the lower portion of the silicon electrode 307; however, it is difficult to significantly reduce the interface resistance by increasing the concentration of p-type impurities, because implantation ions should be prevented from penetrating the substrate, and the above-described concentration of p-type impurities, i.e., $7\times10^{19}$ atoms/cm$^3$, is close to $2\times10^{20}$ atoms/cm$^3$ which is the solubility limit of impurities (after activation annealing at 1050° C.).

An n-type FET also has a problem similar to the problem of the p-type FET.

An object of the present disclosure is to solve the problems, and provide a field-effect transistor which includes a gate electrode having a metal electrode and a silicon electrode formed on the metal electrode, and which can reduce the interface resistance occurring at the interface between the metal electrode and the silicon electrode.

In order to achieve the above objective, the semiconductor device of the present disclosure includes an interface layer which is formed between a metal electrode and a silicon electrode, and which can reduce the interface resistance occurring at the interface therebetween.

Specifically, a semiconductor device according to the present disclosure includes: a first field-effect transistor of a first conductivity type formed on a first active region of a semiconductor substrate. The first field-effect transistor includes a first gate insulating film formed on the first active region, and a first gate electrode formed on the first gate insulating film. The first gate electrode includes a first metal electrode formed on the first gate insulating film, a first interface layer formed on the first metal electrode, and a first silicon electrode formed on the first interface layer.

According to the semiconductor device of the present disclosure, the first gate electrode includes the first interface layer formed between the first metal electrode and the first silicon electrode, and thus, when the first interface layer has a dipole reducing the height of a Schottky barrier formed between the first metal electrode and the first silicon electrode, the energy bands at the interface between the first metal electrode and the first silicon electrode are modulated by the interface layer, thereby reducing the height of the Schottky barrier. This reduces the interface resistance occurring between the first metal electrode and the first silicon electrode.

In the semiconductor device of the present disclosure, the first interface layer may include a first lower film formed on the first metal electrode, and a first upper film formed on the first lower film, and the first lower film and the first upper film may be made of different insulating materials.

In this case, one of the first lower film and the first upper film may be a first silicon dioxide film, and the other film may be a first metal oxide film.

Furthermore, in this case, the first field-effect transistor may be an n-type transistor, the first lower film may be the first metal oxide film, the first upper film may be the first silicon dioxide film, and the first metal oxide film may be made of lanthanum oxide, germanium oxide, yttrium oxide, lutetium oxide, or strontium oxide.

Moreover, in this case, the semiconductor device may have the following second configuration. The first field-effect transistor may be an n-type transistor, the first lower film may be the first silicon dioxide film, the first upper film may be the first metal oxide film, and the first metal oxide film may be made of aluminum oxide, magnesium oxide, hafnium oxide, zirconium oxide, titanium oxide, tantalum oxide, or scandium oxide.

Thus, not only the interface resistance between the first metal electrode and the first silicon electrode can be reduced, but also diffusion of metal atoms represented by aluminum atoms and causing the threshold voltage of the transistor to vary into the gate insulating film can be reduced.

The first field-effect transistor is preferably an n-type transistor, and the first lower film preferably has a lower surface density of oxygen atoms than the first upper film.

As such, in an n-type FET using an n-type silicon electrode (with a work function of about 4.1 eV) as the first silicon electrode, a material having a lower surface density of oxygen atoms than the first upper film is used as the first lower film. In this case, at the interface between the first lower film and the first upper film, negative oxygen ions travel from the first upper film having a higher surface density of oxygen atoms to the first lower film having a lower surface density of oxygen atoms (see, e.g., K. Kita & A. Toriumi, "Intrinsic Origin of Electric Dipoles Formed at High-k/SiO2 Interface," IEDM, p. 29, 2008). Thus, the first upper film is positively charged, and the first lower film is negatively charged, thereby forming a dipole. This reduces the height of the Schottky barrier at the interface between the first metal electrode and the first silicon electrode.

The first field-effect transistor may be a p-type transistor, the first lower film may be the first metal oxide film, the first upper film may be the first silicon dioxide film, and the first metal oxide film may be made of aluminum oxide, magnesium oxide, hafnium oxide, zirconium oxide, titanium oxide, tantalum oxide, or scandium oxide.

The semiconductor device may have the following second configuration. The first field-effect transistor may be a p-type transistor, the first lower film may be the first silicon dioxide film, the first upper film may be the first metal oxide film, and the first metal oxide film may be made of lanthanum oxide, germanium oxide, yttrium oxide, lutetium oxide, or strontium oxide.

Thus, not only the interface resistance between the first metal electrode and the first silicon electrode can be reduced, but also diffusion of metal atoms represented by lanthanum atoms and causing the threshold voltage of the transistor to vary into the gate insulating film can be reduced.

The first field-effect transistor is preferably a p-type transistor, and the first lower film preferably has a higher surface density of oxygen atoms than the first upper film.

As such, in a p-type FET using a p-type silicon electrode (with a work function of about 5.1 eV) as the first silicon electrode, a material having a higher surface density of oxygen atoms than the first upper film is used as the first lower film, thereby reducing the interface resistance. In this case, the first lower film is positively charged, and the first upper film is negatively charged, thereby forming a dipole. This reduces the height of the Schottky barrier at the interface between the first metal electrode and the first silicon electrode.

In the above cases, the first silicon dioxide film may have a thickness greater than or equal to 0.3 nm and equal to or less than 1.0 nm, and the first metal oxide film may have a thickness greater than or equal to 0.3 nm and equal to or less than 2.0 nm.

The semiconductor device of the present disclosure may further include: a second field-effect transistor of a second conductivity type formed on a second active region of the semiconductor substrate. The second field-effect transistor may include a second gate insulating film formed on the second active region, and a second gate electrode formed on the second gate insulating film. The second gate electrode may include a second metal electrode formed on the second gate insulating film, a second interface layer formed on the second metal electrode, and a second silicon electrode formed on the second interface layer. The first interface layer and the second interface layer may contain different insulating materials.

Thus, in a complementary metal insulator semiconductor field-effect transistor (MISFET) having a MIPS structure, the interface resistance between a metal electrode and a silicon electrode can be reduced.

In this case, the second interface layer preferably includes a second lower film formed on the second metal electrode, and a second upper film formed on the second lower film, and the second lower film and the second upper film are preferably made of different insulating materials.

In this case, the first field-effect transistor is preferably an n-type transistor, the second field-effect transistor is preferably a p-type transistor, the first lower film is preferably a first metal oxide film, the first upper film is preferably a first silicon dioxide film, the second lower film is preferably a second metal oxide film, the second upper film is preferably a second silicon dioxide film, and the first metal oxide film and the second metal oxide film are preferably made of different insulating materials.

In this case, lanthanum oxide, germanium oxide, yttrium oxide, lutetium oxide, or strontium oxide can be used as the first metal oxide film, and aluminum oxide, magnesium oxide, hafnium oxide, zirconium oxide, titanium oxide, tantalum oxide, or scandium oxide can be used as the second metal oxide film.

In this case, the semiconductor device may have the following second configuration. The first field-effect transistor is preferably an n-type transistor, the second field-effect transistor is preferably a p-type transistor, the first lower film is preferably a first silicon dioxide film, the first upper film is preferably a first metal oxide film, the second lower film is preferably a second silicon dioxide film, the second upper film is preferably a second metal oxide film, and the first metal oxide film and the second metal oxide film are preferably made of different insulating materials.

In this case, aluminum oxide, magnesium oxide, hafnium oxide, zirconium oxide, titanium oxide, tantalum oxide, or scandium oxide can be used as the first metal oxide film, and lanthanum oxide, germanium oxide, yttrium oxide, lutetium oxide, or strontium oxide can be used as the second metal oxide film.

In the semiconductor device of the present disclosure, the first interface layer preferably has a dipole reducing a height of a Schottky barrier formed between the first metal electrode and the first silicon electrode.

In this case, the first metal electrode is preferably made of a metal material causing a Schottky barrier to occur at an interface formed by bringing the first metal electrode into direct contact with the first silicon electrode.

A method for fabricating a semiconductor device according to the present disclosure includes: forming a gate insulating film on a first active region of a semiconductor substrate; and forming a gate electrode on the gate insulating film. The gate electrode includes a metal electrode formed on the gate insulating film, an interface layer formed on the metal electrode, and a silicon electrode formed on the interface layer.

According to the method of the present disclosure, the gate electrode includes the metal electrode formed on the gate insulating film, the interface layer formed on the metal electrode, and the silicon electrode formed on the interface layer, and thus, when the interface layer has a dipole reducing the height of a Schottky barrier formed between the metal electrode and the silicon electrode, the energy bands at the interface between the metal electrode and the silicon electrode are modulated by the interface layer, thereby reducing the height of the Schottky barrier. This reduces the interface resistance occurring between the metal electrode and the silicon electrode.

In the method of the present disclosure, the interface layer may include a lower film formed on the metal electrode, and an upper film formed on the lower film, and the lower film and the upper film may be made of different insulating materials.

In this case, one of the lower film and the upper film may be a silicon dioxide film, and the other film may be a metal oxide film.

According to the semiconductor device of the present disclosure, and the method for fabricating the same, when a field-effect transistor including a gate electrode having a metal electrode and a silicon electrode formed on the metal electrode is achieved, the interface resistance occurring at the interface between the metal electrode and the silicon electrode can be reduced even with the concentration of impurities in the silicon electrode being low enough to be easily achieved. As a result, degradation in the AC characteristics of semiconductor integrated circuits can be prevented.

BRIEF DESCRIPTION OF THE DRAWINGS

FIG. 7 is a schematic cross-sectional view illustrating a semiconductor device according to a second embodiment of the present disclosure.

DETAILED DESCRIPTION

First Embodiment

A semiconductor device according to a first embodiment of the present disclosure will be described with reference to FIG. 1.

Figure 1:
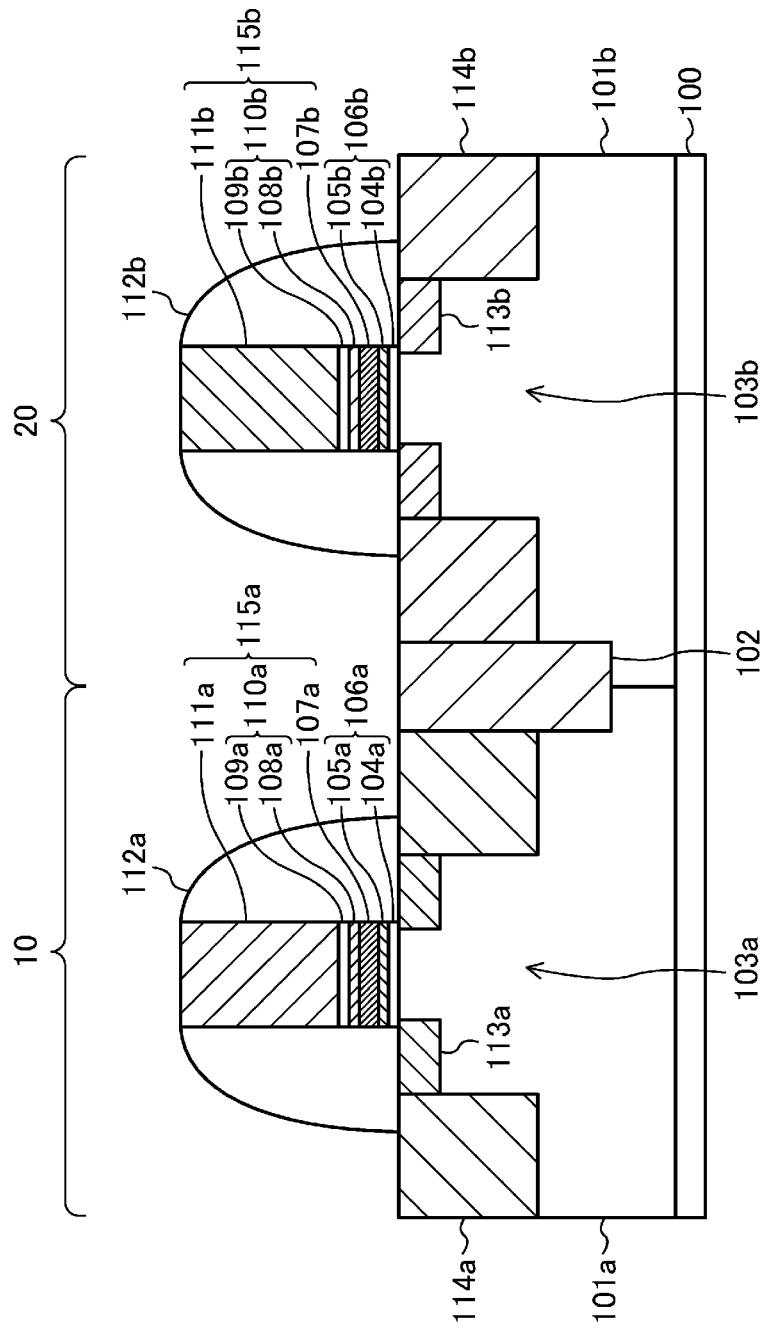
FIG. 1 is a schematic cross-sectional view illustrating a semiconductor device according to a first embodiment of the present disclosure.

As illustrated in FIG. 1, a semiconductor device according to the first embodiment includes, for example, a p-type FET region 10 and an n-type FET region 20 which are formed in a semiconductor substrate 100 made of p-type silicon (Si). An n-well region 101a is formed in the p-type FET region 10 of an upper portion of the semiconductor substrate 100, and an n-type first active region 103a is formed in a region of the n-well region 101a surrounded by an isolation region 102. Similarly, a p-well region 101b is formed in the n-type FET region 20 of the upper portion of the semiconductor substrate 100, and a p-type second active region 103b is formed in a region of the p-well region 101b surrounded by the isolation region 102.

(P-Type FET)

A p-type FET formed on the p-type FET region 10 of the semiconductor substrate 100 includes a first metal electrode 107a formed on the first active region 103a with a first gate insulating film 106a interposed therebetween, a first interface layer 110a formed on the first metal electrode 107a, a p-type first silicon electrode 111a formed on the first interface layer 110a, first sidewall spacers 112a formed on both lateral side surfaces of a structure including the first gate insulating film 106a, the first metal electrode 107a, the first interface layer 110a, and the first silicon electrode 111a, p-type first extension regions 113a formed in regions of an upper portion of the first active region 103a laterally outward of the first silicon electrode 111a, and p-type first source/drain regions 114a formed in regions of the upper portion of the first active region 103a laterally outward of the first extension regions 113a. Here, the concentration of p-type impurities in each of the first source/drain regions 114a is higher than that of p-type impurities in each of the first extension regions 113a. Furthermore, in the p-type FET, the first metal electrode 107a, the first interface layer 110a, and the first silicon electrode 111a are collectively referred to as a first gate electrode 115a.

The first gate insulating film 106a includes a first underlying insulating film 104a having a thickness of, e.g., 1 nm and made of silicon dioxide, and a first high dielectric constant insulating film 105a formed on the first underlying insulating film 104a, having a thickness of, e.g., 2 nm, and made of a metallic oxide which is a high dielectric constant insulator, such as hafnium oxide. Here, the high dielectric constant insulator denotes a material having a higher dielectric constant than silicon nitride (SiN) (e.g., an insulator having a relative dielectric constant higher than or equal to 8).

The first gate electrode 115a includes a first metal electrode 107a formed on the first gate insulating film 106a and made of a metal or a conductive metallic compound, a first interface layer 110a including a first lower film 108a made of aluminum oxide and a first upper film 109a made of silicon dioxide, and a first silicon electrode 111a formed on the first interface layer 110a and made of, e.g., p-type polysilicon. The first lower film 108a and the first upper film 109a are sequentially formed on the first metal electrode 107a.

The first metal electrode 107a is made of, for example, 5-nm-thick tantalum nitride (TaN). The first lower film 108a and the first upper film 109a both forming the first interface layer 110a each have a thickness of 0.5 nm. The first silicon electrode 111a formed on the first interface layer 110a has a thickness of 100 nm. The concentration of p-type impurities, such as boron (B), in a lower portion of the first silicon electrode 111a, i.e., at the interface between the first silicon electrode 111a and the first interface layer 110a is about $7\times10^{19}$ atoms/cm$^3$. The gate length of the first gate electrode 115a is, e.g., about 40 nm, and the width of each of the first sidewall spacers 112a is, e.g., about 40 nm.

The p-type first extension regions 113a are located in regions of the upper portion of the first active region 103a under the first sidewall spacers 112a, and overlap with corresponding end portions of the first gate electrode 115a in the gate length direction when viewed in plan. Furthermore, the first extension regions 113a are doped with p-type impurities, such as boron (B), and the highest concentration of the impurities in each of the first extension regions 113a is about $2\times10^{20}$ atoms/cm$^3$. The junction depth of each of the first extension regions 113a, i.e., the depth of the pn junction interface between the first extension region 113a and the n-type first active region 103a from the lower surface of a corresponding one of the first sidewall spacers 112a (the surface of the semiconductor substrate 100) is about 20 nm. Moreover, although not shown, known pocket regions doped with n-type impurities, such as arsenic (As) or phosphorus (P), may be formed in the first active region 103a of the semiconductor substrate 100 to cover lower and lateral sides of the first extension regions 113a. For example, the concentration of the n-type impurities in the pocket regions may be about $3\times10^{18}$ atoms/cm$^3$. When such n-type pocket regions are formed in the first active region 103a, this allows better short channel characteristics of the p-type FET.

The p-type first source/drain regions 114a are formed in regions of the upper portion of the first active region 103a outward of the first extension regions 113a relative to the first gate electrode 115a so as to be connected to the first extension regions 113a. The first source/drain regions 114a are doped with p-type impurities, such as boron (B), and the highest concentration of the impurities in each of the first source/drain regions 114a is about $1\times10^{21}$ atoms/cm$^3$. The junction depth of each of the first source/drain regions 114a, i.e., the depth of the pn junction interface between the first source/drain region 114a and the n-type first active region 103a from the surface of the semiconductor substrate 100 is about 80 nm.

A portion of the first active region 103a under the first gate electrode 115a is doped with n-type impurities to form an n-well region 101a and control the threshold voltage. The n-type impurities are, e.g., arsenic (As) or phosphorus (P), and the concentration of the impurities in the portion of the first active region 103a under the first gate electrode 115a is about $1\times10^{17}$ atoms/cm$^3$.

(N-Type FET)

In contrast, an n-type FET formed on the n-type FET region 20 of the semiconductor substrate 100 includes a second metal electrode 107b formed on the second active region 103b with a second gate insulating film 106b interposed therebetween, a second interface layer 110b formed on the second metal electrode 107b, an n-type second silicon electrode 111b formed on the second interface layer 110b, second sidewall spacers 112b formed on both lateral side surfaces of a structure including the second gate insulating film 106b, the second metal electrode 107b, the second interface layer 110b, and the second silicon electrode 111b, n-type second extension regions 113b formed in regions of an upper portion of the second active region 103b laterally outward of the second silicon electrode 111b, and n-type second source/drain regions 114b formed in regions of the upper portion of the second active region 103b laterally outward of the second extension regions 113b. Here, the concentration of n-type impurities in each of the second source/drain regions 114b is higher than that of n-type impurities in each of the second extension regions 113b. Furthermore, in the n-type FET, the second metal electrode 107b, the second interface layer 110b, and the second silicon electrode 111b are collectively referred to as a second gate electrode 115b.

The second gate insulating film 106b includes a second underlying insulating film 104b having a thickness of, e.g., 1 nm and made of silicon dioxide, and a second high dielectric constant insulating film 105b formed on the second underlying insulating film 104b, having a thickness of, e.g., 2 nm, and made of hafnium oxide.

The second gate electrode 115b includes a second metal electrode 107b formed on the second gate insulating film 106b and made of a metal or a conductive metallic compound, a second interface layer 110b including a second lower film 108b made of lanthanum oxide and a second upper film 109b made of silicon dioxide, and a second silicon electrode 111b formed on the second interface layer 110b and made of, e.g., n-type polysilicon. The second lower film 108b and the second upper film 109b are sequentially formed on the second metal electrode 107b.

For example, the second metal electrode 107b is made of, e.g., 5-nm-thick tantalum nitride (TaN). The second lower film 108b and the second upper film 109b both forming the second interface layer 110b each have a thickness of 0.5 nm. The second silicon electrode 111b formed on the second interface layer 110b has a thickness of 100 nm. The concentration of n-type impurities, such as phosphorus (P), in a lower portion of the second silicon electrode 111b, i.e., at the interface between the second silicon electrode 111b and the second interface layer 110b is about $7 \times 10^{19}$ atoms/cm$^3$. The gate length of the second gate electrode 115b is, e.g., about 40 nm, and the width of each of the second sidewall spacers 112b is, e.g., about 40 nm.

The n-type second extension regions 113b are located in regions of the upper portion of the second active region 103b under the second sidewall spacers 112b, and overlap with corresponding end portions of the second gate electrode 115b in the gate length direction when viewed in plan. Furthermore, the second extension regions 113b are doped with n-type impurities, such as arsenic (As), and the highest concentration of the impurities in each of the second extension regions 113b is about $2 \times 10^{20}$ atoms/cm$^3$. The junction depth of each of the second extension regions 113b, i.e., the depth of the pn junction interface between the second extension region 113b and the p-type second active region 103b from the lower surface of a corresponding one of the second sidewall spacers 112b (the surface of the semiconductor substrate 100) is about 20 nm. Moreover, although not shown, known pocket regions doped with p-type impurities, such as boron (B) or indium (In), may be formed in the second active region 103b of the semiconductor substrate 100 to cover lower and lateral sides of the second extension regions 113b. For example, the concentration of the p-type impurities in each of the pocket regions may be about $3 \times 10^{18}$ atoms/cm$^3$. When such p-type pocket regions are formed in the second active region 103b, this allows better short channel characteristics of the n-type FET.

The n-type second source/drain regions 114b are formed in regions of the upper portion of the second active region 103b outward of the second extension regions 113b relative to the second gate electrode 115b so as to be connected to the second extension regions 113b. The second source/drain regions 114b are doped with n-type impurities, such as arsenic (As) or phosphorus (P), and the highest concentration of the impurities in each of the second source/drain regions 114b is about $1 \times 10^{21}$ atoms/cm$^3$. The junction depth of each of the second source/drain regions 114b, i.e., the depth of the pn junction interface between the second source/drain region 114b and the p-type second active region 103b from the surface of the semiconductor substrate 100 is about 80 nm.

A portion of the second active region 103b under the second gate electrode 115b is doped with p-type impurities to form a p-well region 101b and control the threshold voltage. The p-type impurities are, e.g., boron or indium, and the concentration of the impurities in the portion of the second active region 103b under the second gate electrode 115b is about $1 \times 10^{17}$ atoms/cm$^3$.

A mechanism for reducing the height of a Schottky barrier formed at each of the interface between the first metal electrode 107a and the first silicon electrode 111a and the interface between the second metal electrode 107b and the second silicon electrode 111b in the semiconductor device configured as described above will be described hereinafter with reference to FIG. 2.

Figure 2:
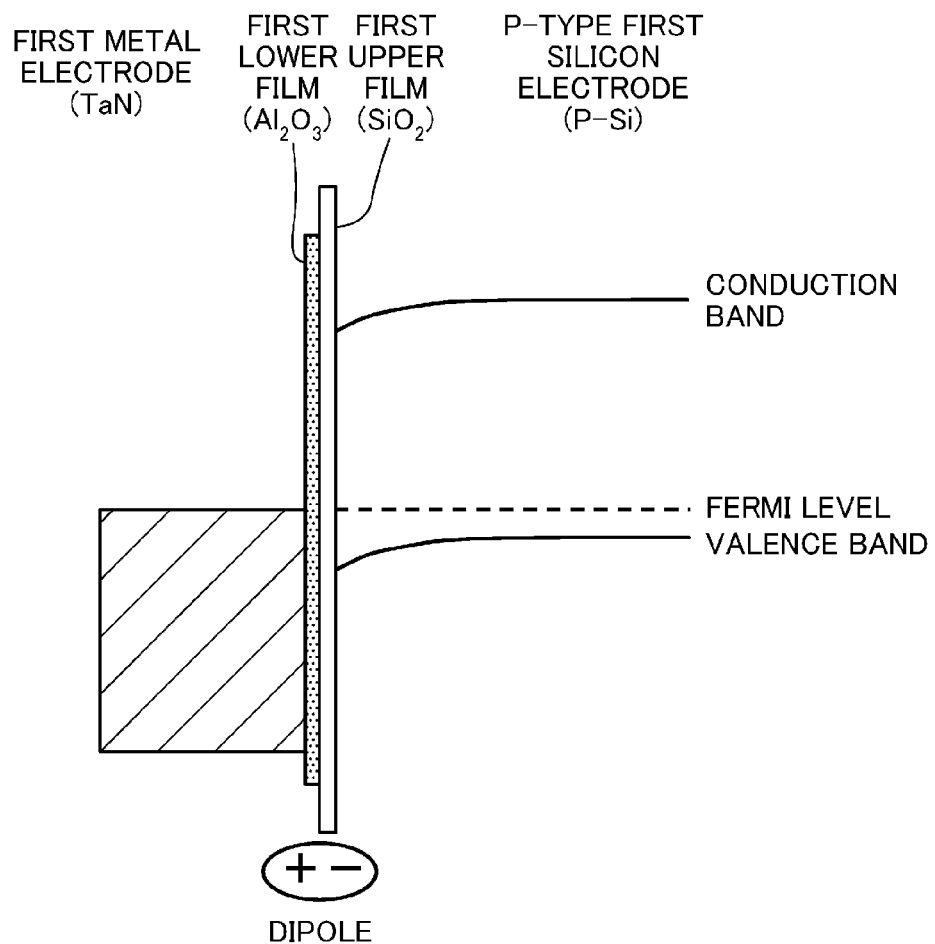
FIG. 2 is a diagram illustrating energy bands between a metal electrode and a silicon electrode in the semiconductor device according to the first embodiment of the present disclosure.
Figure 11:
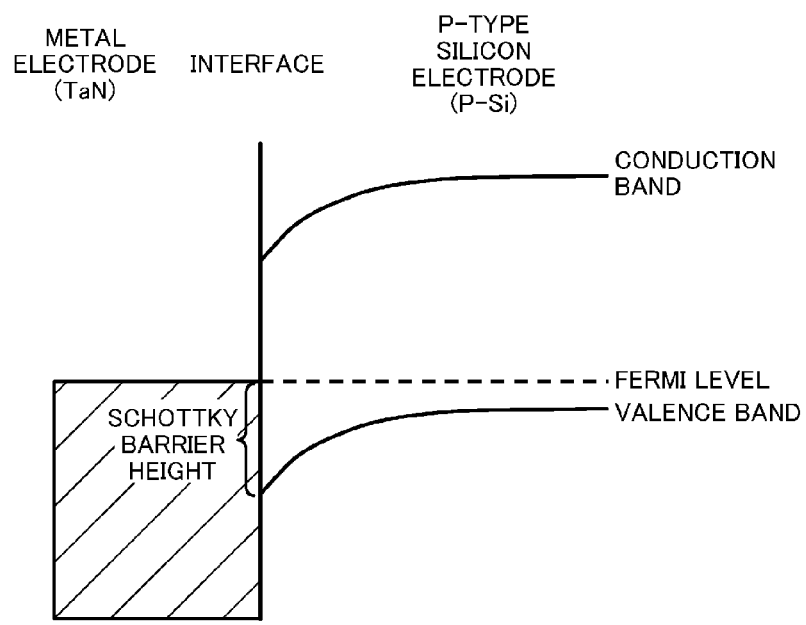
FIG. 11 is a diagram illustrating energy bands between a metal electrode and a silicon electrode in a semiconductor device having a conventional MIPS structure.

FIG. 2 illustrates an energy band diagram of the first gate electrode 115a forming a portion of the p-type FET illustrated in FIG. 1 in a direction perpendicular to the substrate surface. As described above, when a metal electrode made of TaN (with a work function of 4.5 eV) is brought into direct contact with a silicon electrode made of p-type polysilicon (with a work function of 5.1 eV), energy bands are as illustrated in FIG. 11. Specifically, the energy bands of p-type polysilicon are bent downward at the interface between the metal electrode and the p-type silicon electrode, and a Schottky barrier (with a barrier height of 0.6 eV) is formed.

In contrast, in the p-type FET according to the first embodiment, the first interface layer 110a is formed to produce a dipole (electric dipole) at the interface between the first metal electrode 107a made of tantalum nitride (TaN) and the first silicon electrode 111a made of p-type polysilicon, and the bend in each of the energy bands can be modulated by the influence of the dipole. Here, when aluminum oxide (Al$_2$O$_3$) is used as the first lower film 108a formed on the first metal electrode 107a, and silicon dioxide (SiO$_2$) is used as the first upper film 109a formed on the first lower film 108a, negatively charged oxygen ions travel from the first lower film 108a having a high surface density of oxygen atoms to the first upper film 109a having a low surface density of oxygen atoms due to the difference in surface density of oxygen atoms between the first lower film 108a and the first upper film 109a (see, e.g., K. Kita & A. Toriumi, "Intrinsic Origin of Electric Dipoles Formed at High-k/SiO2 Interface," IEDM, p. 29, 2008). As a result, the first lower film 108a is positively charged, and the first upper film 109a is negatively charged, thereby producing a dipole. The amount of each of the energy bands modulated by the produced dipole depends on the ratio between the surface density of oxygen atoms in a material of the first lower film 108a and the surface density of oxygen atoms in a material of the first upper film 109a, and in the above case, the amount of the energy band modulated is about 0.5 eV. Consequently, as illustrated in FIG. 2, the bend in each of the energy bands of the p-type first silicon electrode 111a is reduced. In this case, the height of the Schottky barrier is reduced from its original value, i.e., 0.6 eV, to about 0.1 eV (=0.6 eV−0.5 eV), and thus, the interface resistance caused by the Schottky barrier is extremely low, e.g., $1 \times 10^{-7}$ Ωcm$^2$ or less.

The dipole is formed at the interface between the first lower film 108a and the first upper film 109a of the first interface layer 110a. Therefore, even when the thickness of each of the first lower and upper films 108a and 109a is very small, e.g., 0.5 nm as in this embodiment, the energy bands can be modulated by the dipole. This can sufficiently reduce the increase in resistance due to provision of the first interface layer 110a at the interface between the first metal electrode 107a and the first silicon electrode 111a. This reduction can reduce the resistance occurring at the interface between the first metal electrode 107a and the first silicon electrode 111a (the interface resistance due to the formation of the Schottky barrier and the resistance due to the first interface layer 110a), thereby reducing degradation in the AC characteristics of a semiconductor integrated circuit including a p-type FET.

Also in the n-type FET, the interface resistance occurring at the interface between the second metal electrode 107b and the n-type second silicon electrode 111b can be reduced by a mechanism similar to the mechanism of the p-type FET. This can reduce degradation in the AC characteristics of a semiconductor integrated circuit. However, in the n-type FET, energy bands forming a Schottky barrier are bent upward, i.e., in a direction opposite to the direction in which the energy bands are bent in the p-type FET, and thus, for example, lanthanum oxide ($La_2O_3$) having a lower surface density of oxygen atoms than silicon dioxide used as the second upper film 109b needs to be used as the second lower film 108b formed on the second metal electrode 107b. In this case, a dipole is formed by negatively charging the second lower film 108b, and positively charging the second upper film 109b, and thus, the bend in each of the energy bands can be reduced. This can reduce the interface resistance between the second metal electrode 107b and the second silicon electrode 111b.

As such, a feature of the semiconductor device of the first embodiment is that the interface layers 110a and 110b each producing a dipole oriented to reduce the Schottky barrier formed by providing contact between a corresponding one of the metal electrodes 107a and 107b and a corresponding one of the silicon electrode 111a and 111b thereon are each disposed at the interface therebetween. Furthermore, the interface layers 110a and 110b producing the dipole can have an extremely small thickness, and each of the lower films 108a and 108b each having a thickness of e.g., 0.5 nm and a corresponding one of the upper films 109a and 109b each having a thickness of e.g., 0.5 nm are laminated; therefore, the increase in resistance due to the interface layers 110a and 110b can be reduced. This can reduce the resistance occurring at each of the interface between the metal electrode 107a and the silicon electrode 111a and the interface between the metal electrode 107b and the silicon electrode 111b on the metal electrode 107b (the interface resistances due to the formation of Schottky barriers and the resistances due to the interface layers 110a and 110b), thereby reducing degradation in the AC characteristics of a semiconductor integrated circuit including the p-type FET and the n-type FET.

Aluminum oxide is used as the first lower film 108a of the first interface layer 110a of the p-type FET, and lanthanum oxide is used as the second lower film 108b of the second interface layer 110b of the n-type FET; however, materials of the films are not limited to the above materials. Specifically, the dipole produced at the interface between each of the lower films 108a and 108b and a corresponding one of the upper films 109a and 109b may be oriented to reduce the height of the Schottky barrier formed by providing contact between a corresponding one of the metal electrodes 107a and 107b and a corresponding one of the silicon electrodes 111a and 111b, and materials of the films can be optionally selected.

For example, in the p-type FET, instead of aluminum oxide, a material having a higher surface density of oxygen atoms than silicon dioxide, such as magnesium oxide, hafnium oxide, zirconium oxide, titanium oxide, tantalum oxide, or scandium oxide, can be used as the first lower film 108a. In contrast, in the n-type FET, instead of lanthanum oxide, a material having a lower surface density of oxygen atoms than silicon dioxide, such as germanium oxide, yttrium oxide, lutetium oxide, or strontium oxide, can be used as the second lower film 108b.

The preferable thicknesses of the lower films 108a and 108b and the upper films 109a and 109b will be described below. The lower films 108a and 108b are made of materials each having a relatively small energy band gap, and thus, each preferably have a thickness greater than or equal to 0.3 nm and equal to or less than 2 nm in order to reduce resistance components from the lower films 108a and 108b. In contrast, silicon dioxide forming the upper films 109a and 109b is a material having a relatively large energy band gap, and thus, in order to reduce resistance components from the upper films 109a and 109b, the upper films 109a and 109b each preferably have a thickness greater than or equal to 0.3 nm and equal to or less than 1 nm.

Furthermore, the lower films 108a and 108b do not need to be completely separated from the corresponding upper films 109a and 109b. For example, in the p-type FET, a few silicon atoms may be diffused from the first upper film 109a into the first lower film 108a containing aluminum oxide as a main component, and a few aluminum atoms may be diffused from the first lower film 108a into the first upper film 109a containing silicon dioxide as a main component. Specifically, as long as the distributions of aluminum oxide and silicon dioxide in the first interface layer 110a are nonuniform, and a dipole is formed in the first interface layer 110a by such material distributions, the present disclosure is advantageous.

Materials of the metal electrodes 107a and 107b are not limited to tantalum nitride. A feature of the present disclosure is that in order to reduce the interface resistance by reducing the height of the Schottky barrier formed by providing contact between each of the metal electrodes 107a and 107b and a corresponding one of the silicon electrodes 111a and 111b thereon, the interface layers 110a and 110b are formed at the interface between the metal electrode 107a and the silicon electrode 111a and the interface between the metal electrode 107b and the silicon electrode 111b to each produce a dipole. Therefore, in the p-type FET, when a material having a lower work function than the p-type first silicon electrode 111a is used as the first metal electrode 107a, the present disclosure becomes advantageous. Similarly, in the n-type FET, when a material having a higher work function than the n-type second silicon electrode 111b is used as the second metal electrode 107b, the present disclosure becomes advantageous. In particular, when the difference in work function between each of the metal electrodes 107a and 107b and a corresponding one of the silicon electrodes 111a and 111b thereon, i.e., the height of the Schottky barrier, is 0.2 eV or more, the present disclosure is more advantageous.

The impurity concentration in the lower portion of each of the silicon electrodes 111a and 111b is not limited to the above example. The interface resistance between silicon and a metal is determined by a combination of the height of the Schottky barrier and the impurity concentration. Therefore, if the height of the Schottky barrier can be reduced, the impurity concentration may be low. In contrast, if the height of the Schottky barrier cannot be sufficiently reduced, the impurity concentration is preferably increased to the highest possible concentration. In particular, when the impurity concentration in the lower portion of each of the silicon electrodes 111a and 111b is higher than or equal to $1 \times 10^{19}$ atoms/cm$^3$ and equal to or lower than $2 \times 10^{20}$ atoms/cm$^3$, the present disclosure is advantageous.

Polysilicon containing germanium (Ge), i.e., polysilicon germanium, can be used as the silicon electrodes 111a and 111b, and can increase the solubility limit of impurities, such as boron.

As illustrated in FIG. 1, the p-type FET includes the first interface layer 110a including the first lower film 108a and the first upper film 109a, and the n-type FET includes the second interface layer 110b including the second lower film 108b and the second upper film 109b; however, both of the FETs do not always need to each include a corresponding one of the interface layers 110a and 110b. For example, when a material having a high work function, such as tungsten (with a work function of about 4.9 eV), is used as the metal electrodes 107a and 107b, the height of the Schottky barrier formed by the first metal electrode 107a and the first silicon electrode 111a in the p-type FET is low, e.g., about 0.2 eV. Thus, the p-type FET does not always need to include the first interface layer 110a.

In contrast, when, in the n-type FET, tungsten is used as the second metal electrode 107b, the height of the Schottky barrier is very high, e.g., about 0.8 eV (=4.9 eV–4.1 eV). Thus, provision of the second interface layer 110b can effectively reduce the interface resistance. Similarly, when a material having a low work function, such as aluminum (with a work function of about 4.1 eV) is used as the first metal electrode 107a, the interface resistance can be effectively reduced by allowing only the p-type FET to include the first interface layer 110a.

(Fabrication Method of First Embodiment)

A method for fabricating a semiconductor device according to the first embodiment will be described hereinafter with reference to FIGS. 3A-6.

Figure 3A:
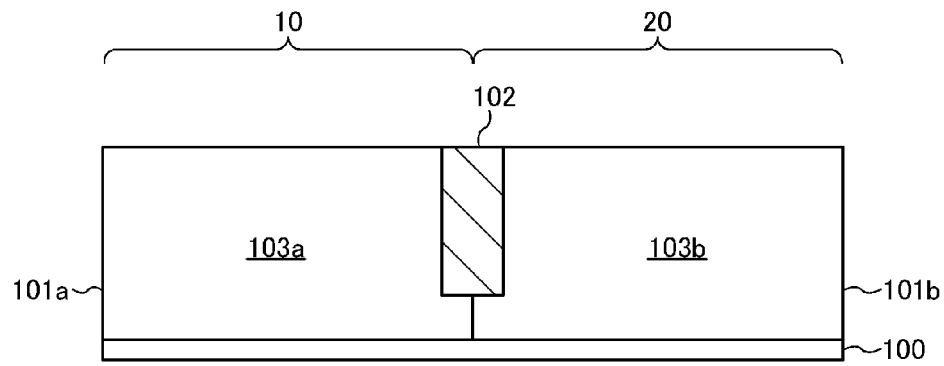
FIGS. 3A-3C are schematic cross-sectional views sequentially illustrating process steps in a method for fabricating a semiconductor device according to the first embodiment of the present disclosure.

First, as illustrated in FIG. 3A, an isolation region 102 is selectively formed in an upper portion of a semiconductor substrate 100 containing p-type impurities, such as boron, and made of silicon by, e.g., a shallow trench isolation (STI) process to define a p-type FET region 10 and an n-type FET region 20. Subsequently, an n-well region 101a and a p-well region 101b are formed in the p-type FET region 10 and the n-type FET region 20, respectively. Thereafter, the n-well region 101a and the p-well region 101b are doped with impurities for adjusting the threshold voltages, thereby forming first and second active regions 103a and 103b which are suitable for a p-type FET and an n-type FET, respectively, and both have an impurity concentration of about $1 \times 10^{17}$ atoms/cm$^3$.

Figure 3B:
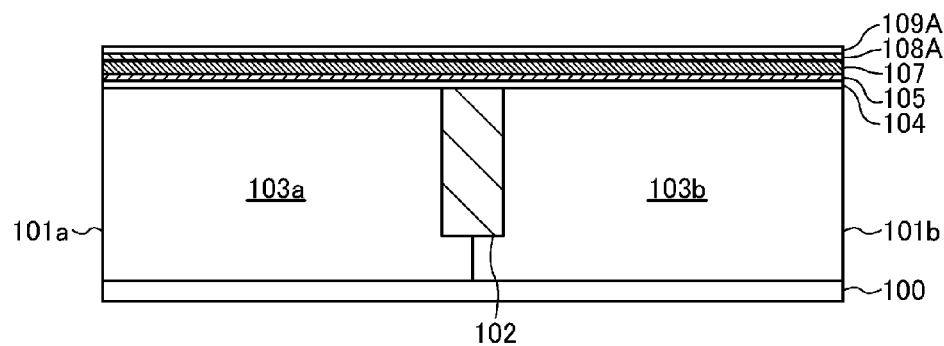

Next, as illustrated in FIG. 3B, a 1-nm-thick silicon dioxide film 104 and a 2-nm-thick hafnium oxide film 105 both for formation of gate insulating films are sequentially deposited on the active regions 103a and 103b. Here, for example, thermal oxidation can be used to form the silicon dioxide film 104, and, for example, chemical vapor deposition (CVD) can be used to form the hafnium oxide film 105. Subsequently, a 5-nm-thick tantalum nitride film 107 for formation of metal electrodes is deposited on the hafnium oxide film 105. Subsequently, a 0.5-nm-thick aluminum oxide film 108A which will be partially a first lower film of a first interface layer of the p-type FET, and a 0.5-nm-thick silicon dioxide film 109A which will be partially a first upper film thereof are sequentially deposited on the tantalum nitride film 107.

Figure 3C:
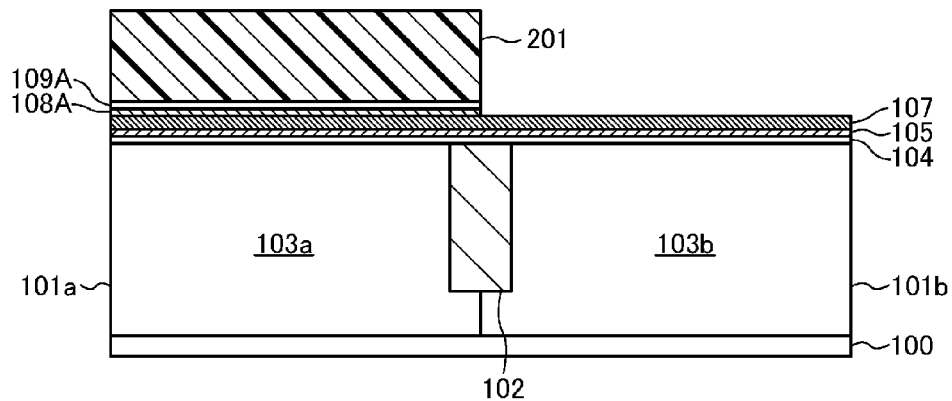

Next, as illustrated in FIG. 3C, a first resist pattern 201 is formed on the semiconductor substrate 100 by lithography to have an opening pattern in the n-type FET region 20. Thereafter, a portion of the silicon dioxide film 109A and a portion of the aluminum oxide film 108A which are located on the n-type FET region 20 are sequentially removed using the first resist pattern 201 as a mask. Specifically, the portion of the silicon dioxide film 109A is removed using hydrofluoric acid, and subsequently, the portion of the aluminum oxide film 108A is removed using a tetramethyl ammonium hydroxide (TMAH) solution. Thus, a portion of the tantalum nitride film 107 located on the n-type FET region 20 is exposed. Thereafter, the first resist pattern 201 is removed.

Figure 4A:
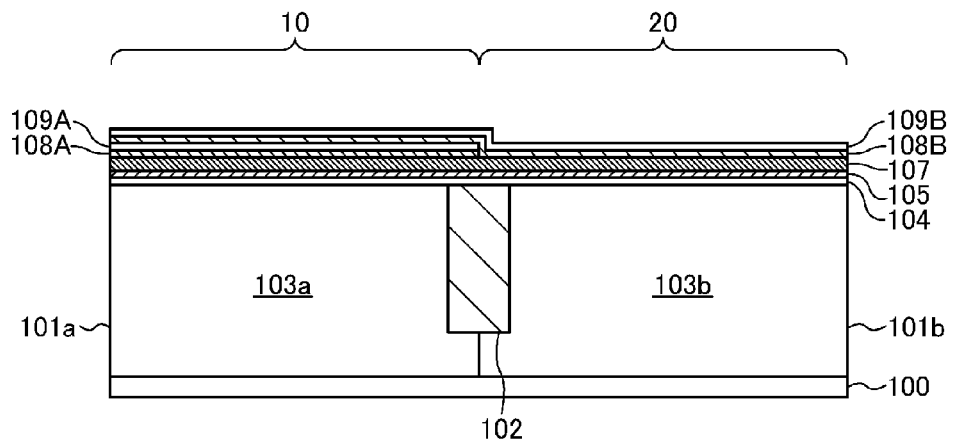
FIGS. 4A-4C are schematic cross-sectional views sequentially illustrating process steps in the method for fabricating a semiconductor device according to the first embodiment of the present disclosure.

Next, as illustrated in FIG. 4A, a 0.5-nm-thick lanthanum oxide film 108B which will be partially a second lower film of a second interface layer of the n-type FET, and a 0.5-nm-thick silicon dioxide film 109B which will be partially a second upper film thereof are sequentially deposited on the entire surface region of the semiconductor substrate 100, i.e., on a portion of the silicon dioxide film 109A located on the p-type FET region 10 and a portion of the tantalum nitride film 107 located on the n-type FET region 20.

Figure 4B:
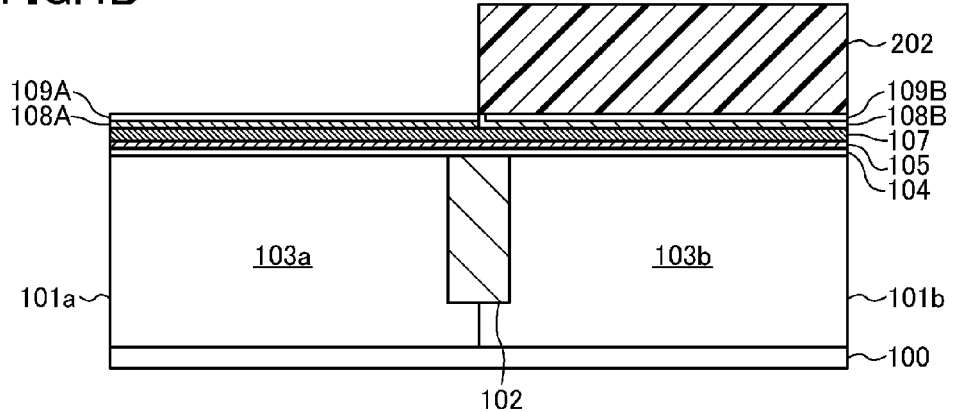

Next, as illustrated in FIG. 4B, a second resist pattern 202 is formed on the semiconductor substrate 100 by lithography to have an opening pattern in the p-type FET region 10. Thereafter, a portion of the silicon dioxide film 109B and a portion of the lanthanum oxide film 108B which are located on the p-type FET region 10 are sequentially removed using the second resist pattern 202 as a mask. Specifically, the portion of the silicon dioxide film 109B is removed using hydrofluoric acid, and subsequently, the portion of the lanthanum oxide film 108B is removed using hydrochloric acid. Thus, a portion of the silicon dioxide film 109A located on the p-type FET region 10 is exposed. The order in which the aluminum oxide film 108A and the silicon dioxide film 109A are formed and the order in which the lanthanum oxide film 108B and the silicon dioxide film 109B are formed are not particularly limited.

Figure 4C:
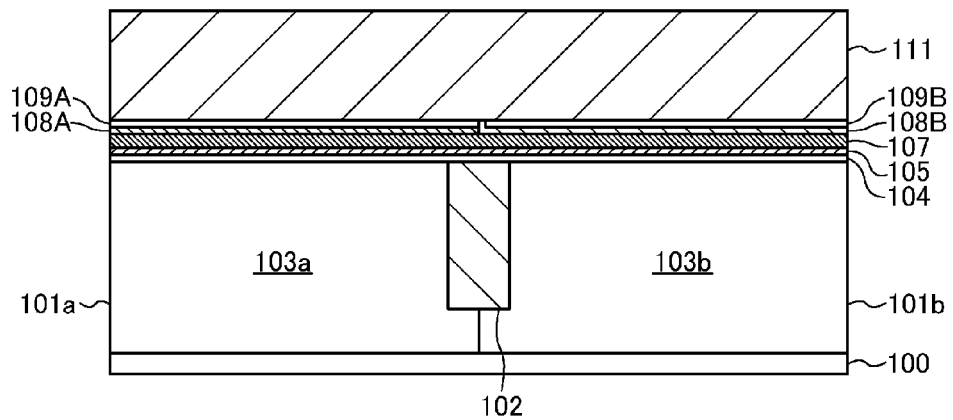

Next, as illustrated in FIG. 4C, the second resist pattern 202 is removed, and then, a 100-nm-thick undoped polysilicon film 111 for formation of silicon electrodes is deposited on the entire surface region of the semiconductor substrate 100, i.e., on a portion of the silicon dioxide film 109A located on the p-type FET region 10 and a portion of the silicon dioxide film 109B located on the n-type FET region 20. The silicon dioxide films 109A and 109B may be formed at the same time in this process step without being separately formed in the process steps illustrated in FIGS. 3B and 4A. This allows the formation of the silicon dioxide films 109A and 109B for formation of the upper films of n-type and p-type FETs in one process step, thereby simplifying the process flow. Although an undoped polysilicon film is used as the polysilicon film 111, a polysilicon germanium film may be used.

Figure 5A:
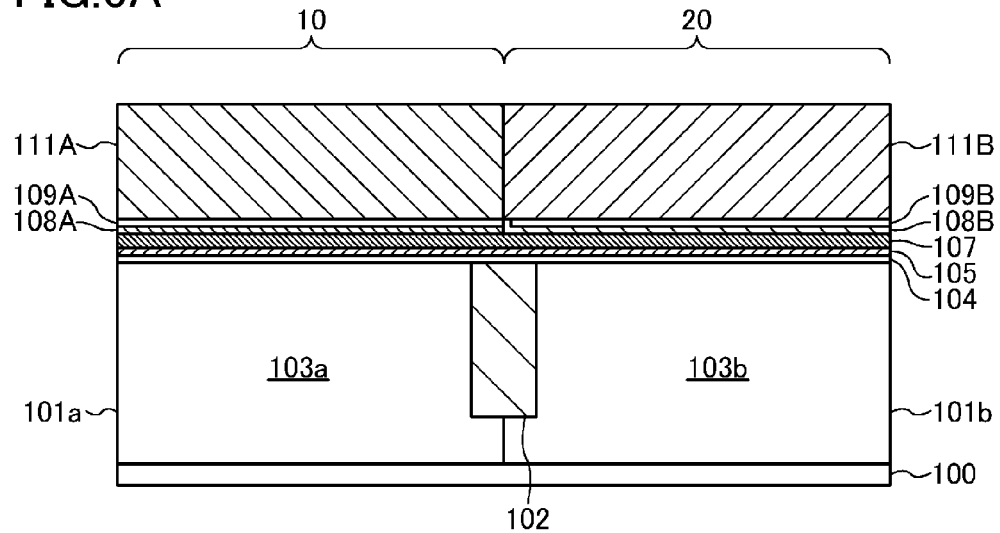
FIGS. 5A-5C are schematic cross-sectional views sequentially illustrating process steps in the method for fabricating a semiconductor device according to the first embodiment of the present disclosure.

Next, as illustrated in FIG. 5A, boron ions are selectively implanted into a portion of the polysilicon film 111 located on the p-type FET region 10 by masking the n-type FET region 20 using a third resist pattern (not shown), thereby changing the portion of the polysilicon film 111 located on the p-type FET region 10 into a p-type polysilicon film 111A. This implantation of boron ions is performed at an acceleration energy of 3 keV and a dose of $4 \times 10^{15}$ atoms/cm$^2$ (to an implantation depth Rp+ΔRp of 25 nm). Subsequently, the third resist pattern is removed, and then, phosphorus ions are selectively implanted into a portion of the polysilicon film 111 located on the n-type FET region 20 by masking the p-type FET region 10 using a fourth resist pattern (not shown), thereby changing the portion of the polysilicon film 111 located on the n-type FET region 20 into an n-type polysilicon film 111B. This implantation of phosphorus ions is performed at an acceleration energy of 8 keV and a dose of $4 \times 10^{15}$ atoms/cm$^2$ (to an implantation depth Rp+ΔRp of 25 nm). Thereafter, the fourth resist pattern is removed, and the polysilicon films 111A and 111B which are doped by the ion implantation are annealed for 30 seconds in a nitrogen atmosphere at a temperature of 750° C. to restore (crystallize) the states of the polysilicon films 111A and 111B from amorphous to crystalline states and eliminate crystal defects. The order in which the p-type polysilicon film 111A and the n-type polysilicon film 111B are formed is not particularly limited.

Figure 5B:
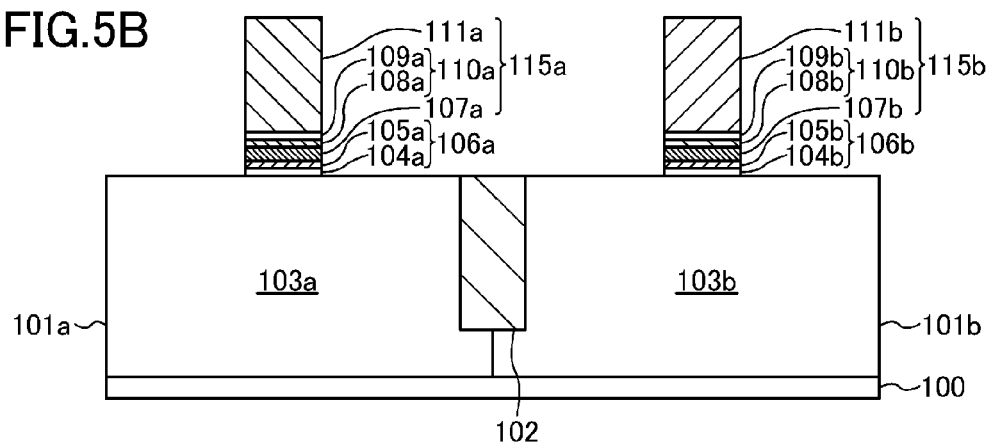

Next, as illustrated in FIG. 5B, a fifth resist pattern (not shown) for formation of first and second gate electrodes is formed to cover the doped polysilicon films 111A and 111B, and the p-type polysilicon film 111A, the silicon dioxide film 109A, the aluminum oxide film 108A, a portion of the tantalum nitride film 107, a portion of the hafnium oxide film 105, and a portion of the silicon dioxide film 104 all on the p-type FET region 10 are sequentially patterned by dry etching using the formed fifth resist pattern as a mask. Similarly, the n-type polysilicon film 111B, the silicon dioxide film 109B, the lanthanum oxide film 108B, a portion of the tantalum nitride film 107, a portion of the hafnium oxide film 105, and a portion of the silicon dioxide film 104 all on the n-type FET region 20 are sequentially patterned by dry etching using the fifth resist pattern as a mask. Here, for example, $Cl_2$/HBr can be used as an etching gas.

Thus, the patterned portion of the silicon dioxide film 104 on the p-type FET region 10 forms a first underlying insulating film 104a, and the patterned portion of the hafnium oxide film 105 thereon forms a first high dielectric constant insulating film 105a, thereby forming a first gate insulating film 106a including the first underlying insulating film 104a and the first high dielectric constant insulating film 105a. The patterned portion of the tantalum nitride film 107 on the p-type FET region 10 forms a first metal electrode 107a. The patterned aluminum oxide film 108A forms a first lower film 108a, and the patterned silicon dioxide film 109A forms a first upper film 109a, thereby forming a first interface layer 110a including the first lower film 108a and the first upper film 109a. The patterned p-type polysilicon film 111A forms a p-type first silicon electrode 111a. As such, a first gate electrode 115a is obtained.

Similarly, the patterned portion of the silicon dioxide film 104 on the n-type FET region 20 forms a second underlying insulating film 104b, and the patterned portion of the hafnium oxide film 105 thereon forms a second high dielectric constant insulating film 105b, thereby forming a second gate insulating film 106b including the second underlying insulating film 104b and the second high dielectric constant insulating film 105b. The patterned portion of the tantalum nitride film 107 on the n-type FET region 20 forms a second metal electrode 107b. The patterned lanthanum oxide film 108B forms a second lower film 108b, and the patterned silicon dioxide film 109B forms a second upper film 109b, thereby forming a second interface layer 110b including the second lower film 108b and the second upper film 109b. The patterned n-type polysilicon film 111B forms an n-type second silicon electrode 111b. As such, a second gate electrode 115b is obtained. The gate length of each of the gate electrodes 115a and 115b is 40 nm.

Figure 5C:
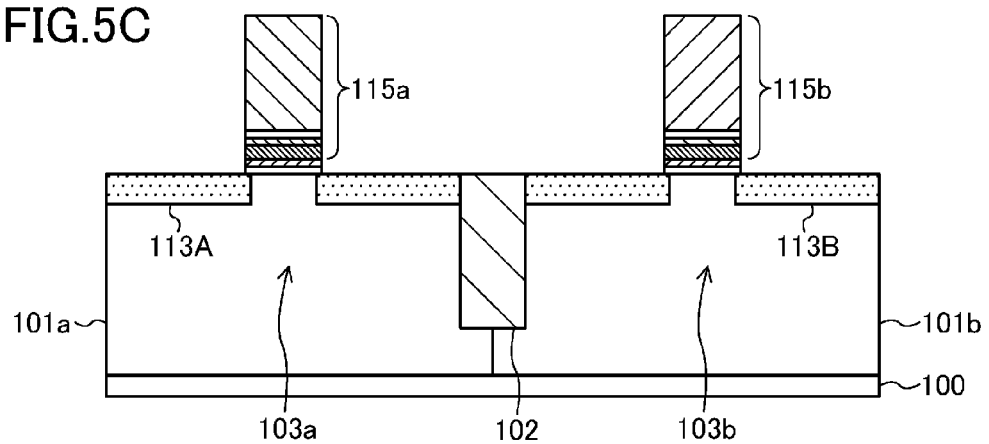

Next, as illustrated in FIG. 5C, the fifth resist pattern is removed, and then, a sixth resist pattern (not shown) is formed to mask the n-type FET region 20. Subsequently, boron difluoride ($BF_2$) ions are implanted into the first active region 103a of the p-type FET region 10 by using the formed sixth resist pattern and the first gate electrode 115a as masks. Thus, p-type first extension implantation regions 113A are formed in regions of an upper portion of the first active region 103a located laterally outward of the first gate electrode 115a. This implantation of boron difluoride ions is performed at an acceleration energy of 2 keV and a dose of $1 \times 10^{15}$ atoms/cm² (to an implantation depth Rp+ΔRp of 4 nm).

Subsequently, the sixth resist pattern is removed, and then, a seventh resist pattern (not shown) is formed to mask the p-type FET region 10. Subsequently, arsenic (As) ions are implanted into the second active region 103b of the n-type FET region 20 by using the formed seventh resist pattern and the second gate electrode 115b as masks. Thus, n-type second extension implantation regions 113B are formed in regions of an upper portion of the second active region 103b located laterally outward of the second gate electrode 115b. This implantation of arsenic ions is performed at an acceleration energy of 2 keV and a dose of $1 \times 10^{15}$ atoms/cm² (to an implantation depth Rp+ΔRp of 7 nm). The order in which the first extension implantation regions 113A and the second extension implantation regions 113B are formed is not particularly limited.

In order to allow better short channel characteristics, before or after the p-type extension implantation, n-type pocket implantation may be performed into the p-type FET region 10. The n-type pocket implantation is performed under the conditions where, for example, arsenic ions are implanted at an acceleration energy of 3 keV, a dose of $3 \times 10^{13}$ atoms/cm², and a tilt angle of 15° (to an implantation depth Rp+ΔRp of 30 nm) with four rotations, and the twist angle for each of the rotations is 0°. Similarly, before or after the n-type extension implantation, p-type pocket implantation may be performed into the n-type FET region 20. The p-type pocket implantation is performed under the conditions where, for example, boron ions are implanted at an acceleration energy of 5 keV, a dose of $3 \times 10^{13}$ atoms/cm², and a tilt angle of 15° (to an implantation depth Rp+ΔRp of 30 nm) with four rotations, and the twist angle for each of the rotations is 0°. Thereafter, the seventh resist pattern is removed.

Figure 6:
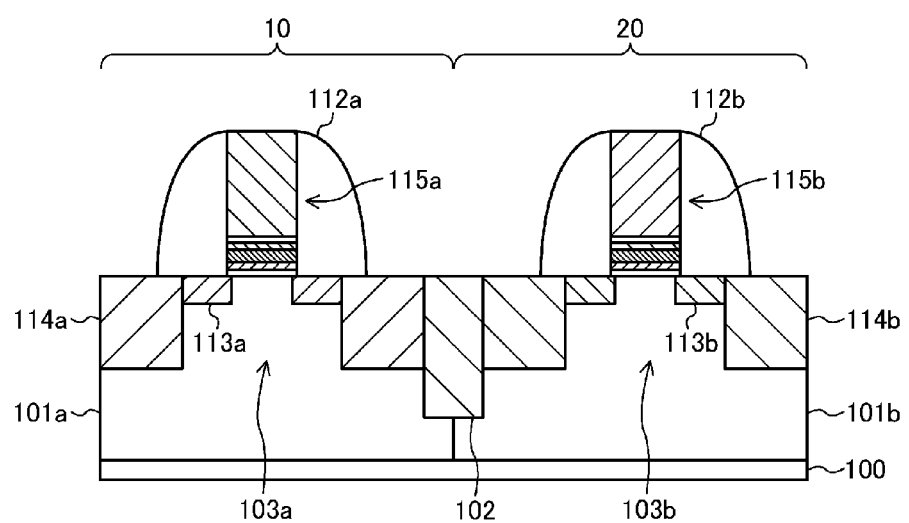
FIG. 6 is a schematic cross-sectional view illustrating a process step in the method for fabricating a semiconductor device according to the first embodiment of the present disclosure.

Next, as illustrated in FIG. 6, an about 40-nm-thick silicon nitride film is formed by CVD to cover the semiconductor substrate 100 and the gate electrodes 115a and 115b. Thereafter, the entire surface of the formed silicon nitride film is etched back by dry etching, thereby forming first and second sidewall spacers 112a and 112b made of 40-nm-wide silicon nitride films on side surfaces of the corresponding gate electrodes 115a and 115b. Subsequently, an eighth resist pattern (not shown) is formed to cover the n-type FET region 20, and boron ions are implanted into the first active region 103a of the p-type FET region 10 by using the formed eighth resist pattern, the first gate electrode 115a, and the first sidewall spacers 112a as masks. Thus, p-type first source/drain implantation regions are formed in portions of the first active region 103a laterally outward of the first gate electrode 115a so as to be connected to the first extension implantation regions 113A. This implantation of boron ions is performed at an acceleration energy of 2 keV and a dose of $1 \times 10^{15}$ atoms/cm².

Subsequently, the eighth resist pattern is removed, and then, a ninth resist pattern (not shown) is formed to cover the p-type FET region 10. Subsequently, phosphorus ions are implanted into the second active region 103b of the n-type FET region 20 by using the formed ninth resist pattern, the second gate electrode 115b, and the second sidewall spacers 112b as masks. Thus, n-type second source/drain implantation regions are formed in portions of the second active region 103b located laterally outward of the second gate electrode 115b so as to be connected to the second extension implantation regions 113B. This implantation of phosphorus ions is performed at an acceleration energy of 8 keV and a dose of $4 \times 10^{15}$ atoms/cm². The order in which the p-type source/drain implantation regions and the n-type source/drain implantation regions are formed is not particularly limited.

Subsequently, the ninth resist pattern is removed, and then, the impurities introduced into the active regions by the ion implantation are activated by spike annealing at a temperature of 1000° C. This activation annealing allows diffusion of boron into the first extension implantation regions 113A, thereby forming p-type first extension regions 113a. Simultaneously, arsenic in the second extension implantation regions 113B is diffused, thereby forming n-type second extension regions 113b. Furthermore, boron in the first source/drain implantation regions and phosphorus in the second source/drain implantation regions are diffused, thereby forming p-type first source/drain regions 114a and n-type second source/drain regions 114b. After the activation annealing, the extension regions 113a and 113b each have a junction depth of about 20 nm, and the source/drain regions 114a and 114b each have a junction depth of about 80 nm.

As such, a feature of the method for fabricating a semiconductor device according to the first embodiment is that as illustrated in FIG. 5B, the method includes a step of forming the interface layer 110a producing a dipole between the metal electrode 107a and the silicon electrode 111a formed on the metal electrode 107a, and forming the interface layer 110b producing a dipole between the metal electrode 107b and the silicon electrode 111b formed on the metal electrode 107b. This can reduce the height of the Schottky barrier formed by providing contact between each of the metal electrodes 107a and 107b and a corresponding one of the silicon electrodes 111a and 111b thereon. As a result, the interface resistance in each of the gate electrodes 115a and 115b can be reduced, and degradation in the AC characteristics of a semiconductor integrated circuit due to the interface resistance can be reduced.

A process for forming the first lower film 108a and the first upper film 109a which form the interface layer 110a, and the second lower film 108b and the second upper film 109b which form the interface layer 110b is not particularly limited; however, in order to reduce variations in the thickness of each of the films, the films are preferably formed by atomic layer deposition (ALD).

Although, in the p-type FET, aluminum oxide is used as the first lower film 108a of the first interface layer 110a, a material of the first lower film 108a is not limited to aluminum oxide, and as described above, a material having a higher surface density of oxygen atoms than silicon dioxide used as the first upper film 109a may be selected. Although, in the n-type FET, lanthanum oxide is used as the second lower film 108b of the second interface layer 110b, a material of the second lower film 108b is not limited to lanthanum oxide, and as described above, a material having a lower surface density of oxygen atoms than silicon dioxide used as the second upper film 109b may be selected.

In the first embodiment, the interface layer producing a dipole is formed in each of the p-type and n-type FETs; however, an interface layer may be formed only in any one of the FETs. Specifically, when the height of a Schottky barrier formed between a metal electrode and a silicon electrode is low, and the interface resistance therebetween is so low as to be insignificant, an FET with low interface resistance does not need to include an interface layer.

Second Embodiment

A semiconductor device according to a second embodiment of the present disclosure will be described hereinafter with reference to FIG. 7.

In the semiconductor device of the second embodiment, the structure of each of interface layers producing a dipole is different from that in the first embodiment, thereby reducing the interface resistance between each metal and silicon, and reducing variations in the threshold voltage of each of transistors.

A difference between the semiconductor device of the second embodiment and the semiconductor device of the first embodiment will be described hereinafter. The same reference characters as those used to represent elements of the semiconductor device shown in FIG. 1 are used to represent equivalent elements, and the explanation thereof will be omitted.

As illustrated in FIG. 7, in the semiconductor device of the second embodiment, the structure of a first interface layer 120a included in a first gate electrode 115a of a p-type FET, and formed between a first metal electrode 107a and a p-type first silicon electrode 111a, and the structure of a second interface layer 120b included in a second gate electrode 115b of an n-type FET, and formed between a second metal electrode 107b and an n-type second silicon electrode 111b are different from those in the semiconductor device of the first embodiment illustrated in FIG. 1.

The first interface layer 120a forming a portion of the first gate electrode 115a includes, for example, a 0.5-nm-thick first lower film 118a formed on the first metal electrode 107a, and made of silicon dioxide, and a 0.5-nm-thick first upper film 119a formed on the first lower film 118a, and made of lanthanum oxide.

The second interface layer 120b forming a portion of the second gate electrode 115b includes, for example, a 0.5-nm-thick second lower film 118b formed on the second metal electrode 107b, and made of silicon dioxide, and a 0.5-nm-thick second upper film 119b formed on the second lower film 118b, and made of aluminum oxide.

As such, the first interface layer 120a is formed between the metal electrode 107a and the silicon electrode 111a thereon, the second interface layer 120b is formed between the metal electrode 107b and the silicon electrode 111b thereon, and the first and second interface layers 120a and 120b produce opposite dipoles, thereby reducing the height of a Schottky barrier formed at the interface between each of the metal electrodes 107a and 107b and a corresponding one of the silicon electrodes 111a and 111b. Such a mechanism for reducing the height of the Schottky barrier is substantially identical with that described in the first embodiment with reference to FIG. 2.

However, since, in the second embodiment, the lower films 118a and 118b made of silicon dioxide are formed on the metal electrodes 107a and 107b, respectively, materials which need to be used as the upper films 119a and 119b formed on the lower films 118a and 118b are different from those in the first embodiment.

Specifically, in the p-type FET on a p-type FET region 10, in order to reduce the height of the Schottky barrier formed between the first metal electrode 107a and the first silicon electrode 111a, the first upper film 119a needs to be made of an insulating film having a lower surface density of oxygen atoms than the first lower film 118a. Therefore, in the second embodiment, unlike the first embodiment, silicon dioxide is used as the first lower film 118a, and, e.g., lanthanum oxide having a lower surface density of oxygen atoms than silicon dioxide is used as the first upper film 119a.

In contrast, in the n-type FET on an n-type FET region 20, in order to reduce the height of the Schottky barrier formed between the second metal electrode 107b and the second silicon electrode 111b, the second upper film 119b needs to be made of an insulating film having a higher surface density of oxygen atoms than the second lower film 118b. Therefore, in the second embodiment, unlike the first embodiment, silicon dioxide is used as the second lower film 118b, and, e.g., aluminum oxide having a higher surface density of oxygen atoms than silicon dioxide is used as the second upper film 119b.

Furthermore, the semiconductor device of the second embodiment can reduce variations in the threshold voltage of each of the p-type and n-type FETs. This mechanism will be described hereinafter.

As described above, according to the present disclosure, the height of the Schottky barrier formed at the interface between each of the metal electrodes 107a and 107b and a corresponding one of the silicon electrodes 111a and 111b thereon is reduced by disposing a corresponding one of the interface layers 120a and 120b having a dipole at the interface therebetween. This reduces the interface resistance between each of the metal electrodes 107a and 107b and a corresponding one of the silicon electrodes 111a and 111b. In order to reduce the interface resistance, a multilayer insulating film obtained by stacking, e.g., a silicon dioxide film and an aluminum oxide film, and producing a dipole is used as each of the interface layers 120a and 120b. However, it has been known that when metal atoms, such as aluminum or lanthanum atoms, contained in the interface layers 120a and 120b are diffused also into gate insulating films 106a and 106b formed under the metal electrodes 107a and 107b by, e.g., heat treatment during fabrication, the threshold voltages of transistors vary (see, e.g., K. Kita & A. Toriumi, "Intrinsic Origin of Electric Dipoles Formed at High-k/SiO2 Interface," IEDM, p. 29, 2008).

To address this problem, in the second embodiment, silicon dioxide films are used as the lower films 118a and 118b formed directly on the metal electrodes 107a and 107b, a lanthanum oxide film is used as the upper film 119a formed on the silicon dioxide film of the p-type FET, and an aluminum oxide film is used as the upper film 119b formed on the silicon dioxide film of the n-type FET. This can reduce variations in the threshold voltage of each of the transistors.

Specifically, the silicon dioxide films formed directly on the metal electrodes 107a and 107b can reduce diffusion of aluminum atoms and lanthanum atoms also into the gate insulating films 106a and 106b. Thus, even when each of the interface layers 120a and 120b containing, e.g., aluminum or lanthanum which may cause the threshold voltages of the transistors to vary is disposed between a corresponding one of the metal electrodes 107a and 107b and a corresponding one of the silicon electrodes 111a and 111b thereon, variations in the threshold voltages of the transistors can be reduced.

Materials of the upper films 119a and 119b are not limited to lanthanum oxide and aluminum oxide, respectively, described above. Specifically, a dipole formed at the interface between each of the lower films 118a and 118b and a corresponding one of the upper films 119a and 119b may be oriented to reduce the height of the Schottky barrier formed by providing contact between a corresponding one of the metal electrodes 107a and 107b and a corresponding one of the silicon electrodes 111a and 111b, and materials of the upper films 119a and 119b can be optionally selected.

For example, in the p-type FET, instead of lanthanum oxide, a material having a lower surface density of oxygen atoms than silicon dioxide forming the first lower film 118a, such as germanium oxide, yttrium oxide, lutetium oxide, or strontium oxide, can be used as the first upper film 119a.

In contrast, in the n-type FET, instead of aluminum oxide, a material having a higher surface density of oxygen atoms than silicon dioxide forming the second lower film 118b, such as magnesium oxide, hafnium oxide, zirconium oxide, titanium oxide, tantalum oxide, or scandium oxide, can be used as the second upper film 119b.

The preferable thicknesses of the lower films 118a and 118b and the upper films 119a and 119b will be described hereinafter. Since silicon dioxide forming the lower films 118a and 118b is a material having a relatively large energy band gap, the thickness of each of the lower films 118a and 118b is preferably greater than or equal to 0.3 nm and equal to or less than 1 nm in order to reduce resistance components from the lower films 118a and 118b. In contrast, since the material of the upper films 119a and 119b has a relatively small energy band gap, the thickness of each of the upper films 119a and 119b is preferably within the range greater than or equal to 0.3 nm and equal to or less than 2 nm in order to reduce resistance components from the upper films 119a and 119b.

Furthermore, the lower films 118a and 118b do not need to be completely separated from the corresponding upper films 119a and 119b. For example, in the p-type FET, a few silicon atoms may be diffused from the first lower film 118a into the first upper film 119a containing lanthanum oxide as a main component, and a few lanthanum atoms may be diffused from the first upper film 119a into the first lower film 118a containing silicon dioxide as a main component. Specifically, as long as the distributions of lanthanum oxide and silicon dioxide in the first interface layer 120a are nonuniform, and a dipole is formed in the first interface layer 120a by such material distributions, the present disclosure is advantageous.

The structures of elements other than the above-described first and second interface layers 120a and 120b are similar to those of the first embodiment.

(Fabrication Method of Second Embodiment)

Essential process steps of a method for fabricating a semiconductor device according to the second embodiment will be described hereinafter with reference to FIGS. 8A-9C.

Figure 8A:
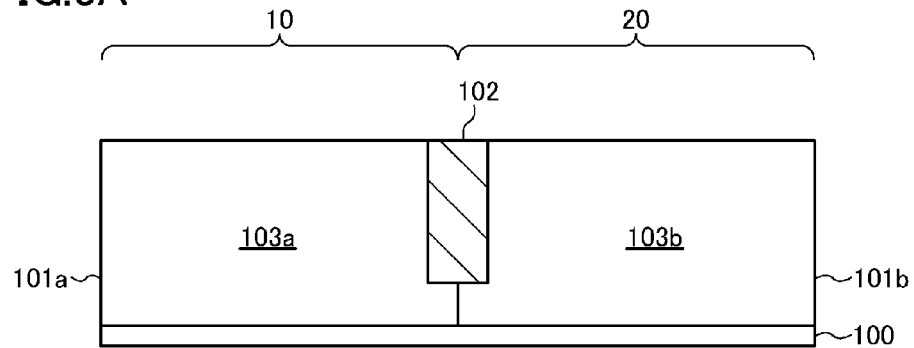
FIGS. 8A-8C are schematic cross-sectional views sequentially illustrating essential process steps in a method for fabricating a semiconductor device according to the second embodiment of the present disclosure.

First, as illustrated in FIG. 8A, an isolation region 102 is selectively formed in an upper portion of a semiconductor substrate 100 containing p-type impurities, such as boron, and made of silicon by, e.g., an STI process to define a p-type FET region 10 and an n-type FET region 20. Subsequently, an n-well region 101a and a p-well region 101b are formed in the p-type FET region 10 and the n-type FET region 20, respectively. Thereafter, the n-well region 101a and the p-well region 101b are doped with impurities for adjusting the threshold voltages, thereby forming first and second active regions 103a and 103b which are suitable for a p-type FET and an n-type FET, respectively, and both have an impurity concentration of about $1 \times 10^{17}$ atoms/cm$^3$.

Figure 8B:
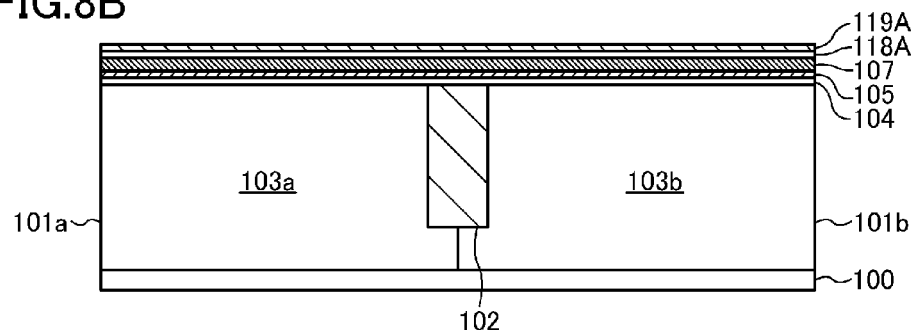

Next, as illustrated in FIG. 8B, a 1-nm-thick silicon dioxide film 104 and a 2-nm-thick hafnium oxide film 105 both for formation of gate insulating films are sequentially deposited on the active regions 103a and 103b. Here, for example, thermal oxidation can be used to form the silicon dioxide film 104, and, for example, CVD can be used to form the hafnium oxide film 105. Subsequently, a 5-nm-thick tantalum nitride film 107 for formation of metal electrodes is deposited on the hafnium oxide film 105. Subsequently, a 0.5-nm-thick silicon dioxide film 118A which will be partially a first lower film of a first interface layer of the p-type FET, and a 0.5-nm-thick lanthanum oxide film 119A which will be partially a first upper film thereof are sequentially deposited on the tantalum nitride film 107.

Figure 8C:
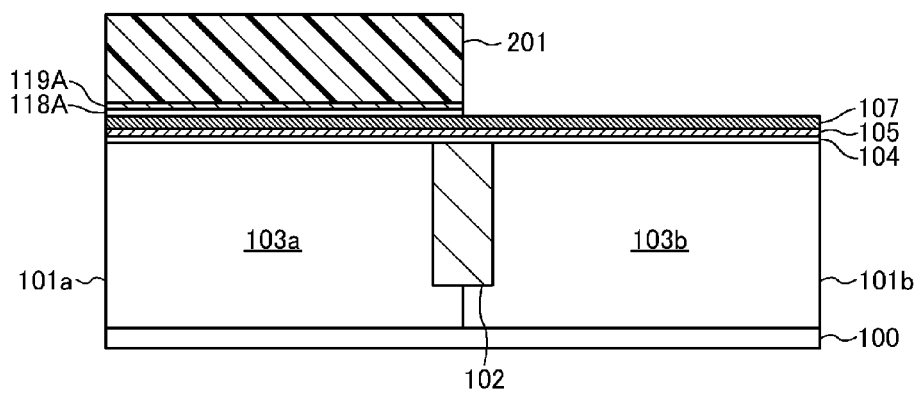

Next, as illustrated in FIG. 8C, a first resist pattern 201 is formed on the semiconductor substrate 100 by lithography to have an opening pattern in the n-type FET region 20. Thereafter, a portion of the lanthanum oxide film 119A and a portion of the silicon dioxide film 118A which are located on the n-type FET region 20 are sequentially removed using the first resist pattern 201 as a mask. Specifically, the portion of the lanthanum oxide film 119A is removed using hydrochloric acid, and subsequently, the portion of the silicon dioxide film 118A is removed using hydrofluoric acid. Thus, a portion of the tantalum nitride film 107 located on the n-type FET region 20 is exposed. Thereafter, the first resist pattern 201 is removed.

Figure 9A:
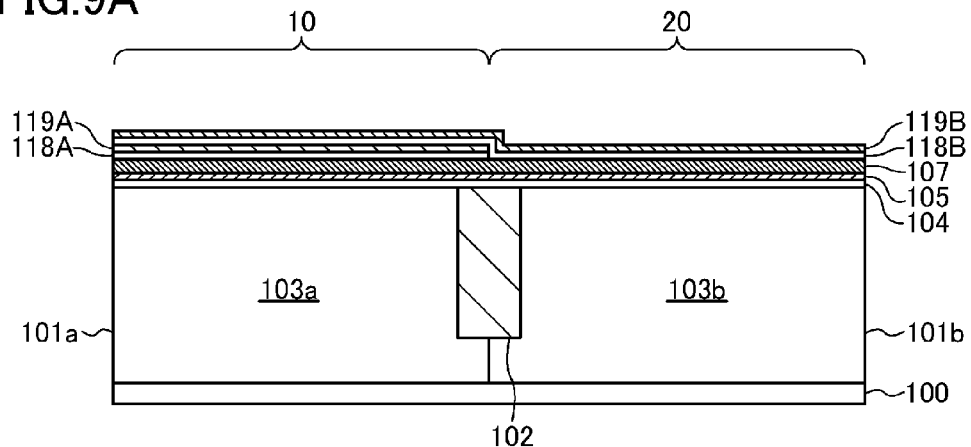
FIGS. 9A-9C are schematic cross-sectional views sequentially illustrating essential process steps in the method for fabricating a semiconductor device according to the second embodiment of the present disclosure.

Next, as illustrated in FIG. 9A, a 0.5-nm-thick silicon dioxide film 118B which will be partially a second lower film of a second interface layer of the n-type FET, and a 0.5-nm-thick aluminum oxide film 119B which will be partially a second upper film thereof are sequentially deposited on the entire surface region of the semiconductor substrate 100, i.e., on a portion of the lanthanum oxide film 119A located on the p-type FET region 10 and a portion of the tantalum nitride film 107 located on the n-type FET region 20.

Figure 9B:
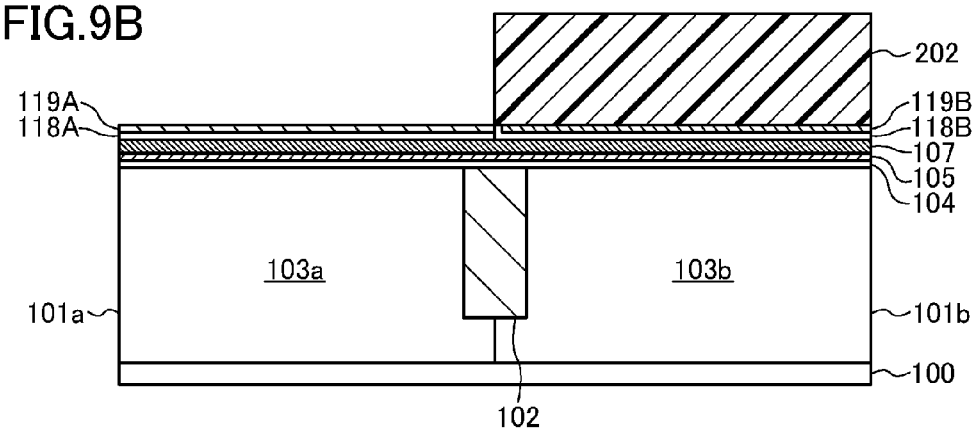

Next, as illustrated in FIG. 9B, a second resist pattern 202 is formed on the semiconductor substrate 100 by lithography to have an opening pattern in the p-type FET region 10. Thereafter, a portion of the aluminum oxide film 119B and a portion of the silicon dioxide film 118B which are located on the p-type FET region 10 are sequentially removed using the second resist pattern 202 as a mask. Specifically, the portion of the aluminum oxide film 119B is removed using a TMAH (tetramethyl ammonium hydroxide) solution, and subsequently, the portion of the silicon dioxide film 118B is removed using hydrofluoric acid. Thus, a portion of the lanthanum oxide film 119A located on the p-type FET region 10 is exposed. The order in which the silicon dioxide film 118A and the lanthanum oxide film 119A are formed and the order in which the silicon dioxide film 118B and the aluminum oxide film 119B are formed are not particularly limited. Instead of separately forming the silicon dioxide films 118A and 118B in the process steps illustrated in FIGS. 8B and 9A, only the portion of the lanthanum oxide film 119A may be removed in the process step illustrated in FIG. 8C with the silicon dioxide film 118A left, only the aluminum oxide film 119B may be deposited in the subsequent process step illustrated in FIG. 9A, and furthermore, only a portion of the aluminum oxide film 119B on the p-type FET region 10 may be selectively removed in the subsequent process step illustrated in FIG. 9B. Thus, the silicon dioxide films 118A and 118B which will be partially the lower films of the interface layers of the n-type and p-type FETs can be continuous, thereby simplifying the process flow.

Figure 9C:
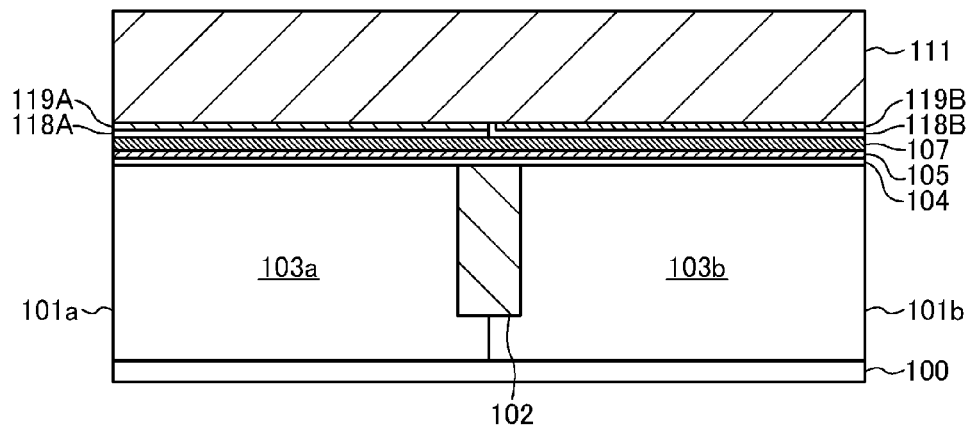
Figure 10:
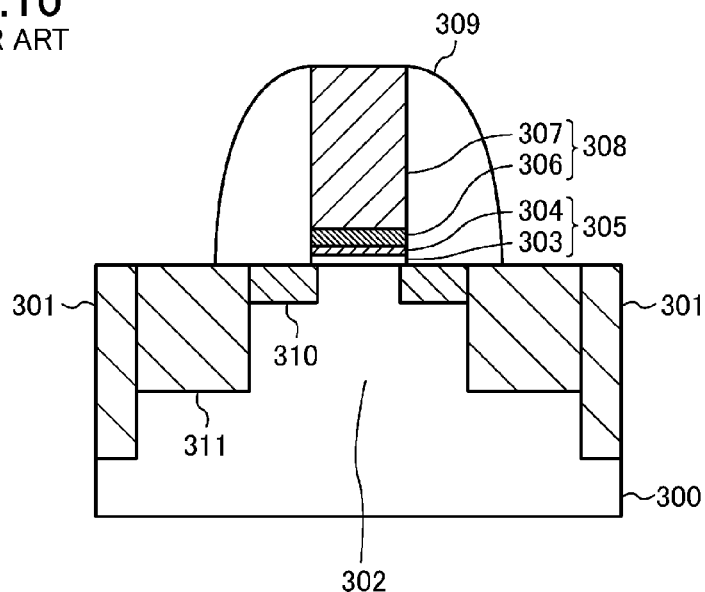
FIG. 10 is a schematic cross-sectional view illustrating a semiconductor device having a conventional MIPS structure.

Next, as illustrated in FIG. 9C, the second resist pattern 202 is removed, and then, a 100-nm-thick undoped polysilicon film 111 for formation of silicon electrodes is deposited on the entire surface region of the semiconductor substrate 100, i.e., on a portion of the lanthanum oxide film 119A located on the p-type FET region 10 and a portion of the aluminum oxide film 119B located on the n-type FET region 20. Although an undoped polysilicon film is used as the polysilicon film 111, a polysilicon germanium film may be used.

Process steps subsequent to this process step are similar to those after the process step illustrated in FIG. 5A in the method for fabricating a semiconductor device according to the first embodiment, and through these fabrication process steps, the semiconductor device of the second embodiment illustrated in FIG. 7 can be achieved.

As described above, a feature of the method for fabricating a semiconductor device according to the second embodiment is that the method includes a step of forming the interface layers 120a and 120b producing a dipole between a corresponding one of the metal electrodes 107a and 107b and a corresponding one of the silicon electrodes 111a and 111b formed on the metal electrodes 107a and 107b. This can reduce the height of the Schottky barrier formed by providing contact between each of the metal electrodes 107a and 107b and a corresponding one of the silicon electrodes 111a and 111b thereon. As a result, the interface resistance in each of the gate electrodes 115a and 115b can be reduced, and degradation in the AC characteristics of a semiconductor integrated circuit due to the interface resistance can be reduced. Furthermore, in the second embodiment, each of the interface layers 120a and 120b includes a corresponding one of the lower films 118a and 118b made of silicon dioxide, and formed on the metal electrodes 107a and 107b, respectively, and a corresponding one of the upper films 119a and 119b made of a material which has a different surface density of oxygen atoms from the surface density of oxygen atoms in silicon dioxide, and is represented by, e.g., lanthanum oxide or aluminum oxide, and formed on the lower films 118a and 118b, respectively. Thus, the silicon dioxide films which are the lower films reduce diffusion of aluminum atoms and lanthanum atoms contained in the upper films 119a and 119b into the gate insulating films 106a and 106b, thereby reducing variations in the threshold voltages of the transistors.

Although a process for forming the lower films 118a and 118b and the upper films 119a and 119b is not particularly limited, the films are preferably formed by ALD in order to reduce variations in the thickness of each of the films.

In the p-type FET, lanthanum oxide is used as the first upper film 119a of the first interface layer 120a; however, a material of the first upper film 119a is not limited to lanthanum oxide, and as described above, a material having a lower surface density of oxygen atoms than silicon dioxide used as the first lower film 118a may be selected. In the n-type FET, aluminum oxide is used as the second upper film 119b of the second interface layer 120b; however, a material of the second upper film 119b is not limited to aluminum oxide, and as described above, a material having a higher surface density of oxygen atoms than silicon dioxide used as the second lower film 118b may be selected.

Although, in the second embodiment, the interface layer producing a dipole is formed in each of the p-type and n-type FETs, the interface layer may be formed in any one of the FETs. Specifically, when the Schottky barrier formed between a metal electrode and a silicon electrode is low, and the interface resistance therebetween is so low as to be insignificant, an FET with low interface resistance does not need to include an interface layer.

For example, the materials and thicknesses of the gate insulating films 106a and 106b, the metal electrodes 107a and 107b, the silicon electrodes 111a and 111b, and the sidewall spacers 112a and 112b, and the impurity materials with which the silicon electrodes 111a and 111b, the extension regions 113a and 113b, and the source/drain regions 114a and 114b are doped, the conditions where the impurities are implanted into the silicon electrodes 111a and 111b and the regions 113a, 113b, 114a, and 114b, and the conditions where the silicon electrodes 111a and 111b and the regions 113a, 113b, 114a, and 114b are subjected to heat treatment were described in the first and second embodiments; however, these materials, thicknesses, and conditions are merely examples. Specifically, the materials and the process conditions may be appropriately changed without departing from the spirit of the invention.

When a field-effect transistor including a gate electrode having a metal electrode and a silicon electrode formed on the metal electrode is achieved, the semiconductor device according to the present disclosure can reduce the interface resistance occurring at the interface between the metal electrode and the silicon electrode, and is useful for, e.g., semiconductor integrated circuit devices requiring excellent AC characteristics.

What is claimed is:

1. A semiconductor device comprising:
a first field-effect transistor of a first conductivity type formed on a first active region of a semiconductor substrate; and
a second field-effect transistor of a second conductivity type formed on a second active region of the semiconductor substrate, wherein
the first field-effect transistor includes:
a first gate insulating film formed on the first active region, and
a first gate electrode formed on the first gate insulating film,
the first gate electrode includes:
a first metal electrode formed on the first gate insulating film,
a first interface layer formed on the first metal electrode, and
a first silicon electrode formed on the first interface layer,
the second field-effect transistor includes:
a second gate insulating film formed on the second active region, and
a second gate electrode formed on the second gate insulating film,
the second gate electrode includes:
a second metal electrode formed on the second gate insulating film,
a second interface layer formed on the second metal electrode,
a second silicon electrode formed on the second interface layer, and
the first interface layer and the second interface layer contain different insulating materials.

2. The semiconductor device of claim 1, wherein
the first interface layer includes a first lower film formed on the first metal electrode, and a first upper film formed on the first lower film, and
the first lower film and the first upper film are made of different insulating materials.

3. The semiconductor device of claim 2, wherein one of the first lower film and the first upper film is a first silicon dioxide film, and the other of the first lower film and the first upper film is a first metal oxide film.

4. The semiconductor device of claim 3, wherein
the first field-effect transistor is an n-type transistor,
the first lower film is the first metal oxide film,
the first upper film is the first silicon dioxide film, and
the first metal oxide film is made of lanthanum oxide, germanium oxide, yttrium oxide, lutetium oxide, or strontium oxide.

5. The semiconductor device of claim 3, wherein
the first field-effect transistor is an n-type transistor,
the first lower film is the first silicon dioxide film,
the first upper film is the first metal oxide film, and
the first metal oxide film is made of aluminum oxide, magnesium oxide, hafnium oxide, zirconium oxide, titanium oxide, tantalum oxide, or scandium oxide.

6. The semiconductor device of claim 2, wherein
the first field-effect transistor is an n-type transistor, and
the first lower film has a lower surface density of oxygen atoms than the first upper film.

7. The semiconductor device of claim 3, wherein
the first field-effect transistor is a p-type transistor,
the first lower film is the first metal oxide film,
the first upper film is the first silicon dioxide film, and
the first metal oxide film is made of aluminum oxide, magnesium oxide, hafnium oxide, zirconium oxide, titanium oxide, tantalum oxide, or scandium oxide.

8. The semiconductor device of claim 3, wherein
the first field-effect transistor is a p-type transistor,
the first lower film is the first silicon dioxide film,
the first upper film is the first metal oxide film, and
the first metal oxide film is made of lanthanum oxide, germanium oxide, yttrium oxide, lutetium oxide, or strontium oxide.

9. The semiconductor device of claim 2, wherein
the first field-effect transistor is a p-type transistor, and
the first lower film has a higher surface density of oxygen atoms than the first upper film.

10. The semiconductor device of claim 3, wherein
the first silicon dioxide film has a thickness greater than or equal to 0.3 nm and equal to or less than 1.0 nm, and
the first metal oxide film has a thickness greater than or equal to 0.3 nm and equal to or less than 2.0 nm.

11. The semiconductor device of claim 1, wherein
the second interface layer includes a second lower film formed on the second metal electrode, and a second upper film formed on the second lower film, and
the second lower film and the second upper film are made of different insulating materials.

12. The semiconductor device of claim 11, wherein
the first field-effect transistor is an n-type transistor,
the second field-effect transistor is a p-type transistor,
the first lower film is a first metal oxide film,
the first upper film is a first silicon dioxide film,
the second lower film is a second metal oxide film,
the second upper film is a second silicon dioxide film, and
the first metal oxide film and the second metal oxide film are made of different insulating materials.

13. The semiconductor device of claim 12, wherein
the first metal oxide film is made of lanthanum oxide, germanium oxide, yttrium oxide, lutetium oxide, or strontium oxide, and
the second metal oxide film is made of aluminum oxide, magnesium oxide, hafnium oxide, zirconium oxide, titanium oxide, tantalum oxide, or scandium oxide.

14. The semiconductor device of claim 11, wherein
the first field-effect transistor is an n-type transistor,
the second field-effect transistor is a p-type transistor,
the first lower film is a first silicon dioxide film,
the first upper film is a first metal oxide film,
the second lower film is a second silicon dioxide film,
the second upper film is a second metal oxide film, and
the first metal oxide film and the second metal oxide film are made of different insulating materials.

15. The semiconductor device of claim 14, wherein
the first metal oxide film is made of aluminum oxide, magnesium oxide, hafnium oxide, zirconium oxide, titanium oxide, tantalum oxide, or scandium oxide, and
the second metal oxide film is made of lanthanum oxide, germanium oxide, yttrium oxide, lutetium oxide, or strontium oxide.

16. The semiconductor device of claim 1, wherein the first interface layer has a dipole reducing a height of a Schottky barrier formed between the first metal electrode and the first silicon electrode.

17. The semiconductor device of claim 1, wherein the first metal electrode is made of a metal material causing a Schottky barrier to occur at an interface formed by bringing the first metal electrode into direct contact with the first silicon electrode.

18. The semiconductor device of claim 1, wherein the second interface layer has a dipole reducing a height of a Schottky barrier formed between the second metal electrode and the second silicon electrode.

19. The semiconductor device of claim 1, wherein the second metal electrode is made of a metal material causing a Schottky barrier to occur at an interface formed by bringing the second metal electrode into direct contact with the second silicon electrode.

* * * * *